US009098647B2

(12) United States Patent
Boyd et al.

(10) Patent No.: US 9,098,647 B2
(45) Date of Patent: Aug. 4, 2015

(54) DYNAMIC VIEWING OF A THREE DIMENSIONAL SPACE

(75) Inventors: Martin Boyd, Marina del Rey, CA (US); Gregory Niles, Culver City, CA (US)

(73) Assignee: APPLE INC., Cupertino, CA (US)

(*) Notice: Subject to any disclaimer, the term of this patent is extended or adjusted under 35 U.S.C. 154(b) by 1466 days.

(21) Appl. No.: 12/045,663

(22) Filed: Mar. 10, 2008

(65) Prior Publication Data

US 2009/0226080 A1 Sep. 10, 2009

(51) Int. Cl.
G09G 5/00 (2006.01)
G06F 17/50 (2006.01)
G06F 3/0481 (2013.01)
G06T 19/00 (2011.01)

(52) U.S. Cl.
CPC ............ *G06F 17/50* (2013.01); *G06F 3/04815* (2013.01); *G06T 19/00* (2013.01); *G06T 2219/028* (2013.01); *G06T 2219/2016* (2013.01)

(58) Field of Classification Search
None
See application file for complete search history.

(56) References Cited

U.S. PATENT DOCUMENTS

| | | | |
|---|---|---|---|
| 5,511,157 A | 4/1996 | Wang | |
| 5,835,693 A | 11/1998 | Lynch et al. | |
| 6,333,749 B1* | 12/2001 | Reinhardt et al. | 345/629 |
| 6,346,938 B1 | 2/2002 | Chan et al. | |
| 6,466,207 B1 | 10/2002 | Gortler et al. | |
| 6,697,068 B2* | 2/2004 | Iizuka et al. | 345/427 |
| 6,828,962 B1* | 12/2004 | McConkie et al. | 345/419 |
| 6,907,579 B2 | 6/2005 | Chang | |
| 6,909,458 B1* | 6/2005 | Suzuki et al. | 348/211.8 |
| 6,990,230 B2 | 1/2006 | Piponi | |
| 7,148,892 B2* | 12/2006 | Robertson et al. | 345/427 |
| 7,149,596 B2* | 12/2006 | Berger et al. | 700/98 |
| 7,298,370 B1* | 11/2007 | Middler et al. | 345/421 |
| 7,336,264 B2 | 2/2008 | Cajolet et al. | |
| 7,428,482 B2* | 9/2008 | Clavadetscher | 703/6 |

(Continued)

FOREIGN PATENT DOCUMENTS

EP 0782104 7/1997
EP 1107188 6/2001

(Continued)

OTHER PUBLICATIONS

Plumlee et al., Integrating Multiple 3D Views through Frame-of-Reference Interaction, 2003, IEEE Proceedings of the Coordinated and Multiple Views in Exploratory Visualization.*

(Continued)

*Primary Examiner* — Aaron M Richer
*Assistant Examiner* — Anh-Tuan V Nguyen
(74) *Attorney, Agent, or Firm* — Adeli LLP

(57) ABSTRACT

Some embodiments provide a three dimensional (3D) media-editing application for dynamically presenting different views of a 3D project that includes one or more objects disbursed throughout a 3D space. A dynamic display provides the dynamic views upon the occurrence of specified triggering events. In some embodiments, the dynamic display appears within the 3D media-editing application throughout the duration of the triggering event and is removed upon completion of the triggering event. The dynamic display of some embodiments shows edits to the 3D project from a predicted angle or viewing perspective that best conveys the objects of the 3D project in conjunction with the actions of the triggering event without duplicating views presented in one or more static workspace windows of the 3D media-editing application.

30 Claims, 18 Drawing Sheets

(56) References Cited

U.S. PATENT DOCUMENTS

| | | | |
|---|---|---|---|
| 7,739,623 B2 * | 6/2010 | Liang et al. | 715/848 |
| 7,782,319 B2 * | 8/2010 | Ghosh et al. | 345/427 |
| 7,802,193 B1 * | 9/2010 | McDonald et al. | 715/757 |
| 7,814,436 B2 | 10/2010 | Schrag et al. | |
| 8,089,479 B2 | 1/2012 | Deb et al. | |
| 8,392,151 B1 * | 3/2013 | Grace et al. | 703/2 |
| 2002/0097248 A1 * | 7/2002 | Kano | 345/622 |
| 2003/0128206 A1 * | 7/2003 | Sinn | 345/419 |
| 2003/0235344 A1 | 12/2003 | Kang et al. | |
| 2004/0219980 A1 * | 11/2004 | Bassett et al. | 463/33 |
| 2005/0028111 A1 | 2/2005 | Schrag et al. | |
| 2005/0219239 A1 | 10/2005 | Mashitani et al. | |
| 2005/0223337 A1 * | 10/2005 | Wheeler et al. | 715/806 |
| 2005/0253872 A1 * | 11/2005 | Goss et al. | 345/660 |
| 2006/0028548 A1 * | 2/2006 | Salivar et al. | 348/143 |
| 2006/0176295 A1 * | 8/2006 | Toho et al. | 345/419 |
| 2006/0205502 A1 | 9/2006 | Kaneshige et al. | |
| 2006/0253781 A1 * | 11/2006 | Pea et al. | 715/723 |
| 2006/0279630 A1 * | 12/2006 | Aggarwal et al. | 348/143 |
| 2007/0046695 A1 * | 3/2007 | Bamberg et al. | 345/619 |
| 2007/0120846 A1 * | 5/2007 | Ok et al. | 345/419 |
| 2007/0146360 A1 | 6/2007 | Clatworthy et al. | |
| 2007/0279435 A1 | 12/2007 | Ng et al. | |
| 2008/0094358 A1 * | 4/2008 | Sullivan | 345/161 |
| 2008/0303746 A1 * | 12/2008 | Schlottmann et al. | 345/1.2 |
| 2009/0024953 A1 * | 1/2009 | Selig | 715/781 |
| 2009/0040186 A1 * | 2/2009 | Esenther | 345/173 |
| 2009/0135184 A1 * | 5/2009 | Tanaka | 345/427 |
| 2009/0191965 A1 * | 7/2009 | Dixon | 463/31 |

FOREIGN PATENT DOCUMENTS

| | | |
|---|---|---|
| EP | 1132123 | 9/2001 |
| WO | WO 2009/114208 | 9/2009 |

OTHER PUBLICATIONS

Otaduy et al., User-Centric Viewpoint Computation for Haptic Exploration and Manipulation, 2001, IEEE Visualization, pp. 311-318 & 567.*

International Preliminary Report on Patentability of PCT/US2009/030783, Sep. 14, 2010 (issuance date), Apple Inc.

Shade, Jonathan, et al., "Layered Depth Images," Proceedings of the 25th Annual Conference on Computer Graphics and Interactive Techniques, Jul. 19-24, 1998, pp. 231-242, ACM, New York, New York, USA.

PCT/US2009/030783, Jan. 12, 2009 (filing date), Apple Inc.

Partial International Search Report for PCT/US2009/030783, Apr. 9, 2009 (mailing date), Apple Inc.

International Search Report for application PCT/US2009/030783, Jun. 22, 2009 (mailing date), Apple Inc.

* cited by examiner

DYNAMIC VIEWING OF A THREE DIMENSIONAL SPACE

FIELD OF THE INVENTION

The present invention is directed towards media editing. Specifically, to dynamically displaying different views of a three dimensional space when performing media editing.

BACKGROUND OF THE INVENTION

Digital graphic design, video editing, and media-editing applications provide designers and artists with the necessary tools to create much of the media seen today through the various media outlets. These tools allow designers the ability to generate, compose, composite, and animate the images and videos in a virtual digital space. In the progression of these tools, the virtual digital space has gone from flat two dimensional (2D) spaces to three dimensional (3D) spaces.

The 3D space provides designers capabilities not previously available within the 2D space. Designers now have the ability to fly virtual cameras throughout the 3D space adding depth to render more lifelike environments. Also, the added third dimension provides designers with a much larger workspace with which to work. Objects such as images, videos, text, shapes, cameras, lights, spatial audio, etc. can be located anywhere in any dimension of the 3D space.

However, the evolution to 3D space has complicated the manner in which the objects within the workspace are displayed. Since the workspace is no longer a flat 2D plane, application developers have had to derive new ways to display all the objects within the 3D space. A single static view that provides a particular viewing perspective or angle of the 3D space simply does not provide designers with the necessary information needed to efficiently modify the objects within the 3D environments. Moving objects and placing objects relative to each other along each of the three dimensions of the 3D space cannot be performed accurately from the single view. FIG. 1 illustrates a single view for an active workspace window 110 of a 3D space within a 3D editing application that includes various editable objects, such as image objects 120 and camera objects 130. By clicking and dragging the various objects, users are able to manipulate the objects within the 3D space. However, because of the single view, users are unable to accurately determine the effect of the object manipulation across all three dimensions and thus at least one height, width, or depth dimension is compromised. For example, in the 3D space of FIG. 1, a user is unable to determine how the movement of an image object 120 relative to a camera object 130 affects what is rendered from the camera object 130.

To attempt to alleviate the problem, application developers provided users with the ability to switch the perspective from which to view the 3D space such that the 3D space is rendered from a more preferred view. One such example is to switch the view to render the 3D space from the view of the camera object 130. However, to do so is time consuming and one view is shown at the expense of not displaying another view. Therefore, when the user makes a change to objects in the 3D space from a first view, the user must revert back to the other views of the 3D space to see how the change in the first view affects what is displayed in the other views.

As a compromise, application developers reduced the size of a single static workspace by introducing multiple simultaneous static workspaces, each workspace providing a different view of the 3D space. Now, when a user manipulates an object within a particular view, the manipulation will be seen from the multiple different views of the other workspaces. However, with every new workspace added, the size of the other workspaces is further reduced. FIG. 2 illustrates a typical 3D editing application that provides an active workspace with a particular view 210 and three additional workspaces 220-240 that each provide different views of the 3D space while occupying equal screen space as the active workspace 210.

In this figure, the 3D space is shown with a perspective view 210, a right side view 220, a top side view 230, and an active camera view 240. However, because of the size of each workspace window, the amount of information that is displayed within each workspace is reduced from what was displayed when using only a single workspace with a single view as above in FIG. 1. Users are able to modify the size and number of the different workspace windows and views displayed onscreen at any given time. However, with each adjustment, the user has to make a tradeoff between the size of the active workspace and the size of each of the other workspaces. This imposes a burden onto the user who now has to manually manage the information displayed on screen.

Users have to anticipate which views are relevant to the manipulations that are to be subsequently performed on the objects within the 3D space. If a particular view is not set, the user has to manually switch one of the multiple views to provide the desired view. Such environment management takes away from time that could otherwise be dedicated working with the objects of the 3D space to create the desired design.

A further problem resulting from the multiple simultaneous workspaces with different views is the computing resources needed to render each of the views. Instead of having to render a scene from a single view, more computing resources are required to render the same scene from multiple different views often taxing the computer system. This caused designers to lose design time as they now had to wait for each of the views to render a single object manipulation multiple times from multiple different views.

Therefore, the multiple simultaneous views commonly employed by 3D editing applications reduces the size of the active workspace, places a burden on the user to manage the different views, and consumes unnecessary computing resources in order to render each of the different views. However, without the multiple simultaneous views, designers are unable to properly work within the digital 3D space. There is thus a need to simplify how and when the different views should be provided to the user such that relevant information needed by the user to manipulate, edit, composite, etc. the objects within the 3D space is provided when needed and avoided when not needed.

SUMMARY OF THE INVENTION

Some embodiments provide a three dimensional (3D) media-editing application for dynamically presenting different views of a 3D project that includes one or more objects disbursed throughout a 3D space. A dynamic display provides the dynamic views upon the occurrence of specified triggering events. In some embodiments, the dynamic display appears within the 3D media-editing application throughout the duration of the triggering event and is removed upon completion of the triggering event. The dynamic display of some embodiments shows edits to the 3D project from a predicted angle or viewing perspective that best conveys the objects of the 3D project in conjunction with the actions of the triggering event without duplicating views presented in one or more static workspace windows of the 3D media-editing application.

In some embodiments, the triggering events include manipulating content of the 3D project. In some embodiments, manipulating content includes manipulating camera objects and non-camera objects within the 3D project. Prior to presenting the dynamic display, some embodiments predict the view for the dynamic display based on the one or more triggering events. In some embodiments, the dynamic display presents the same view of the 3D project for different triggering events. In other embodiments, the dynamic display presents different views of the 3D project for different triggering events. Accordingly, for a manipulation of a first camera object, some embodiments of the dynamic display render the 3D project from a view of the first camera object and for a subsequent manipulation of a second camera object, some embodiments render the 3D project from a view of the second camera object.

BRIEF DESCRIPTION OF THE DRAWINGS

The novel features of the invention are set forth in the appended claims. However, for purpose of explanation, several embodiments of the invention are set forth in the following figures.

FIG. 5 is complete and the dynamic display is removed from the active workspace.

DETAILED DESCRIPTION OF THE INVENTION

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

I. Overview

Some embodiments provide a three dimensional (3D) media-editing application for dynamically presenting different views of a 3D project that includes one or more objects disbursed throughout a 3D space. A dynamic display provides the dynamic views upon the occurrence of specified triggering events. In some embodiments, the dynamic display appears within the 3D media-editing application throughout the duration of the triggering event and is removed upon completion of the triggering event. The dynamic display of some embodiments shows edits to the 3D project from a predicted angle or viewing perspective that best conveys the objects of the 3D project in conjunction with the actions of the triggering event without duplicating views presented in one or more static workspace windows of the 3D media-editing application.

Figure 1:
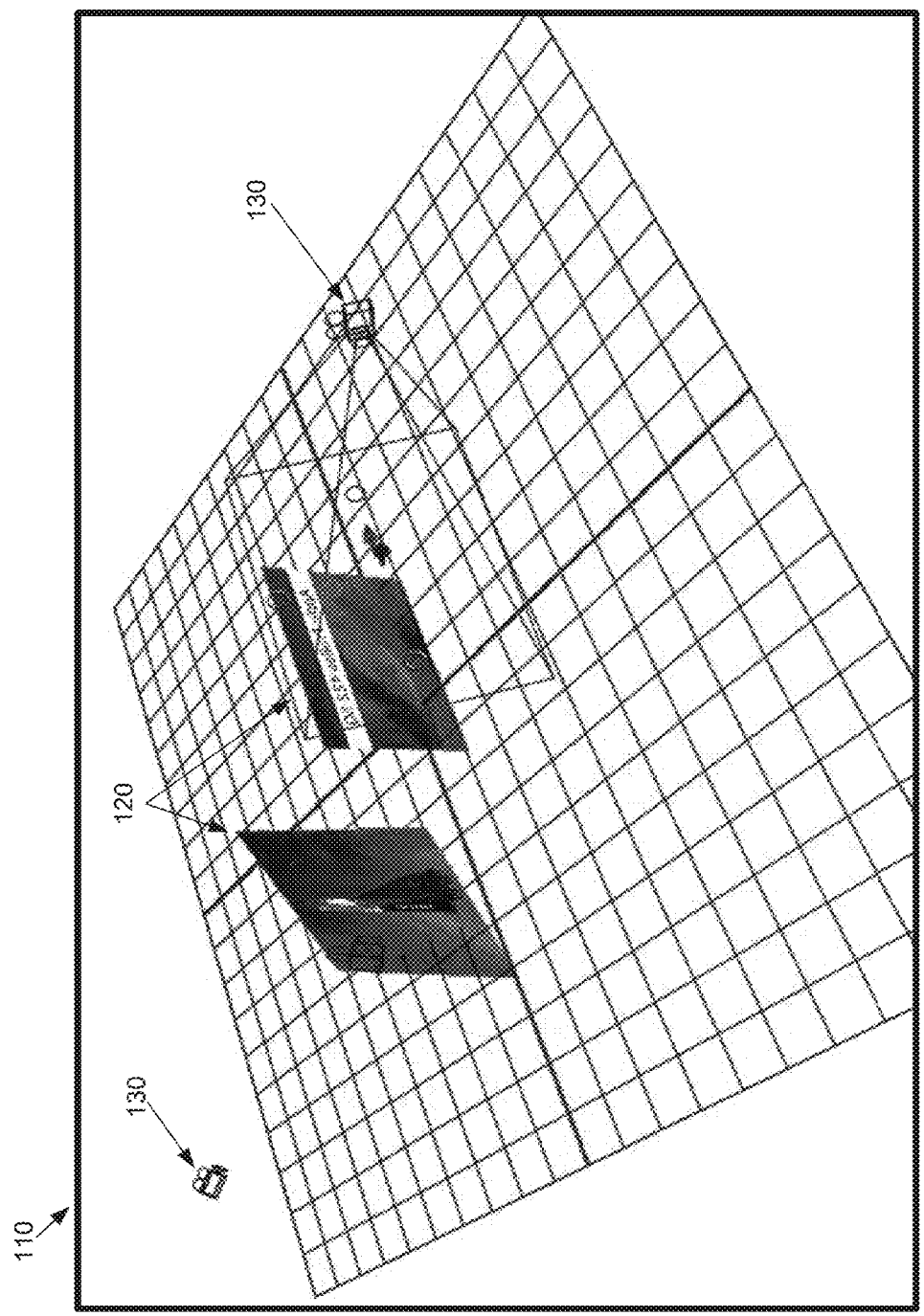
FIG. 1 illustrates a single view for a active workspace of a 3D space window within a 3D editing application that includes various editable objects such as image objects and camera objects.
Figure 2:
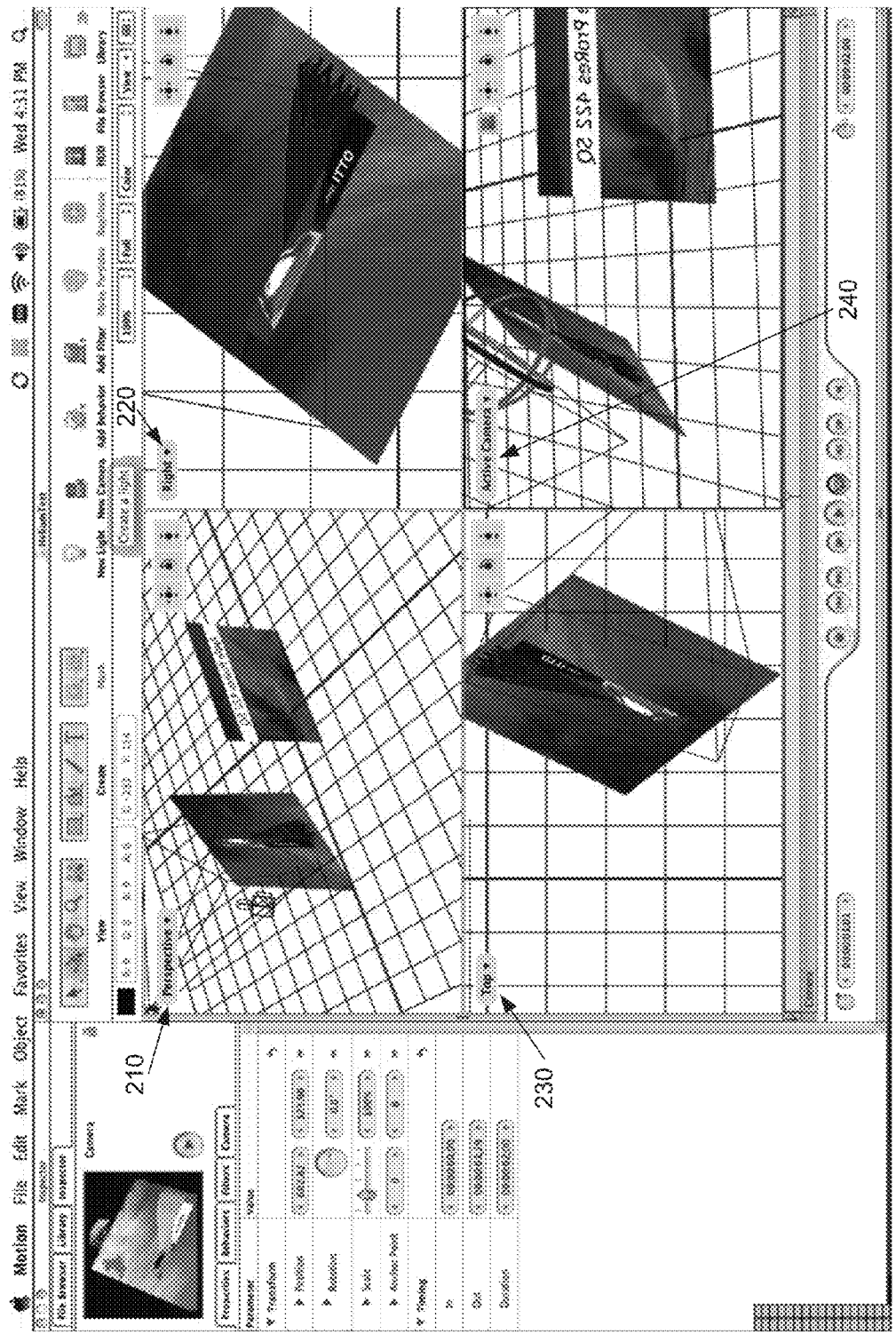
FIG. 2 illustrates a typical 3D editing application that provides an active workspace with a particular view and three different views that occupy equal screen space as the active workspace.
Figure 3:
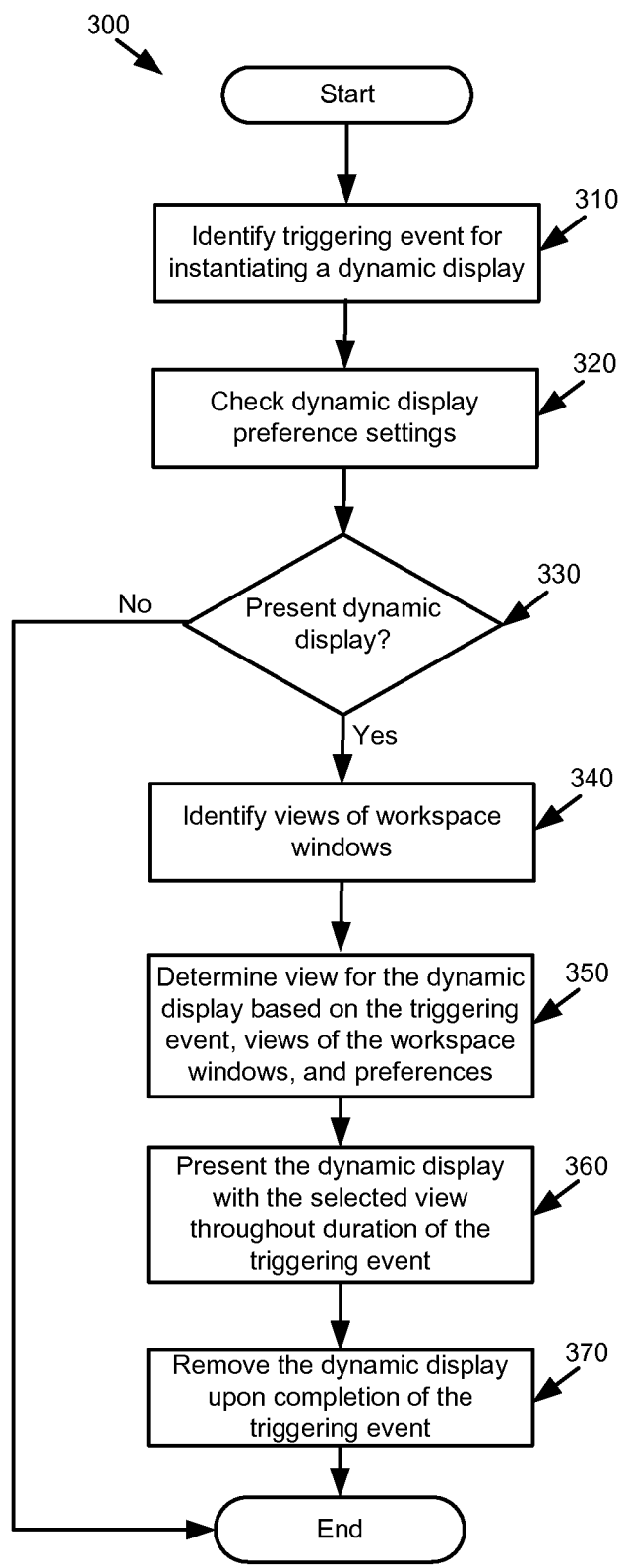
FIG. 3 presents a process for providing the dynamic display upon the occurrence of a triggering event.

FIG. 3 presents a process 300 for providing the dynamic display upon the occurrence of a triggering event. The process 300 begins by identifying (at 310) a triggering event that instantiates the dynamic display. The process then performs (at 320) a check of the dynamic display preference settings. The preferences specify parameters such as the size of the dynamic display, the location within the active workspace to present the dynamic display, the render quality of the dynamic display, etc. The preferences also specify (at 330) whether the dynamic display functionality is enabled. If the dynamic display functionality is disabled, the process ends. Otherwise, the process determines a view for the dynamic display by identifying (at 340) at least one view currently used by one or more active workspace windows of the media-editing application. The process then determines (at 350) the view for the dynamic display based on the triggering event, the dynamic display preference settings, and the currently displayed views of the active workspace such that the same view is not replicated within the dynamic display.

After determining the view for the dynamic display, the dynamic display is presented (at 360) within the media-editing application throughout the duration of the triggering event. Once the triggering event is complete, the process removes (at 370) the dynamic display and the process ends.

Figure 4:
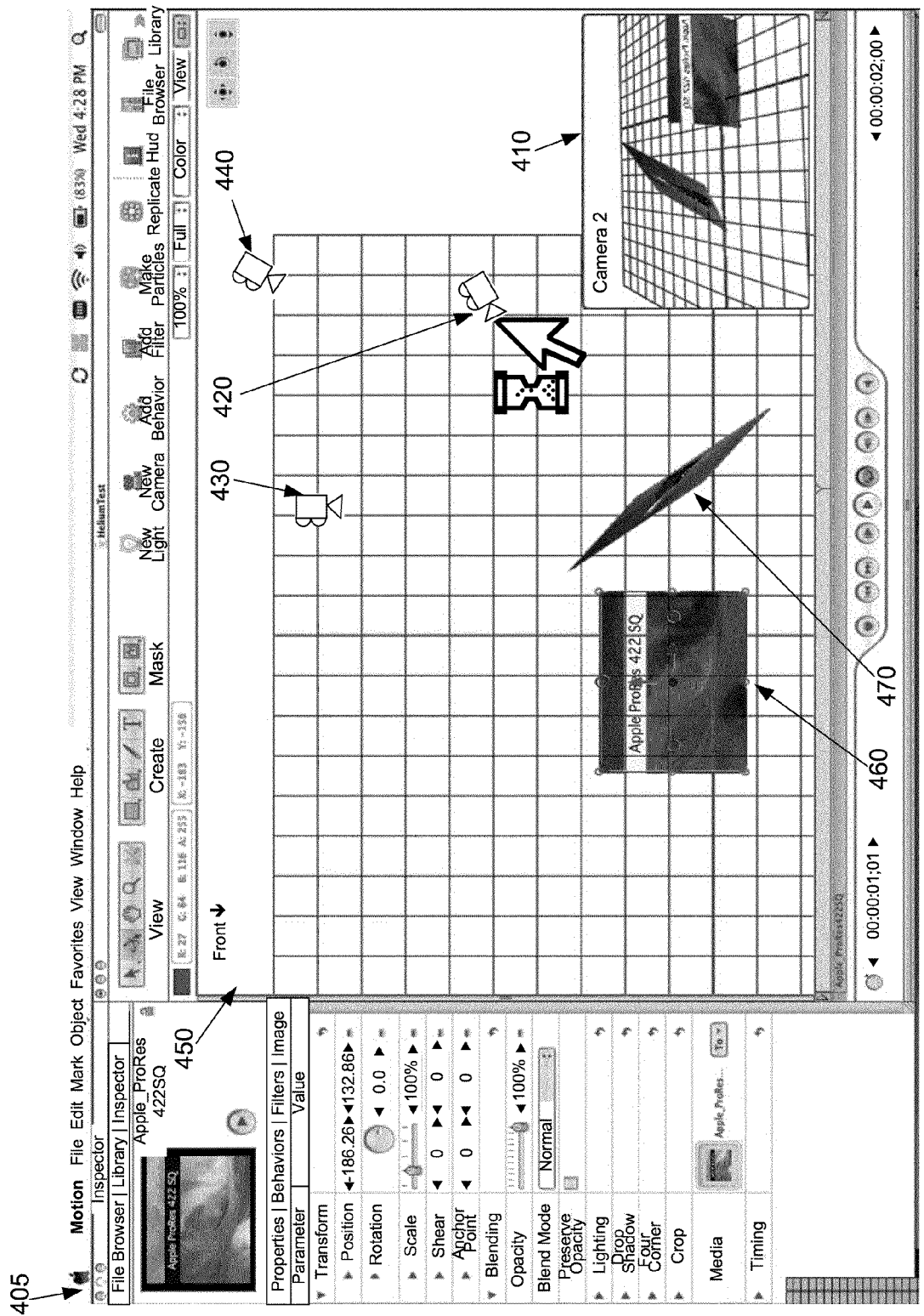
FIG. 4 illustrates a media-editing application with a dynamic display having a view from camera object during the modification of the camera object within an active workspace of the media-editing application.
Figure 5:
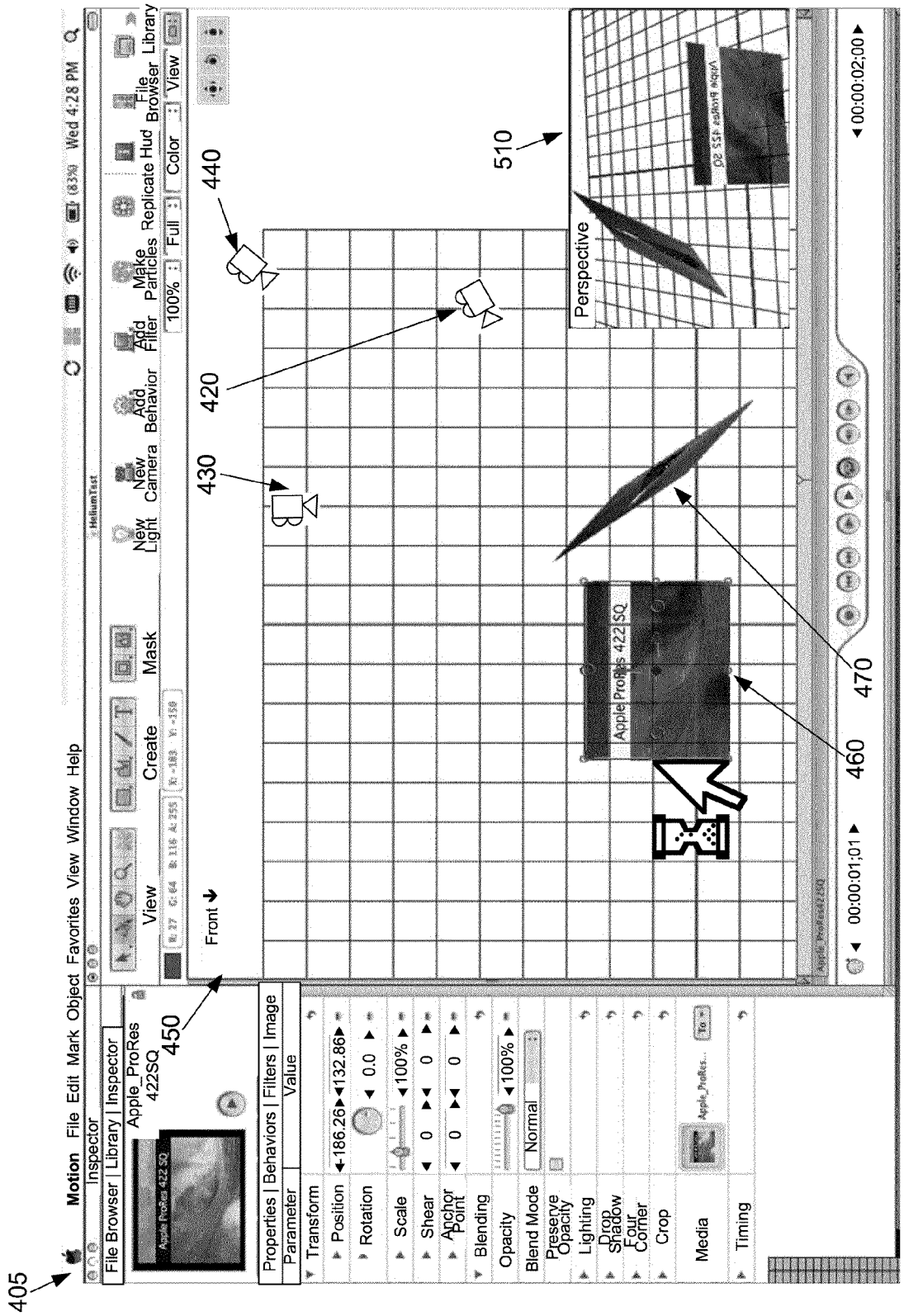
FIG. 5 illustrates a media-editing application with a dynamic display having a different view than the dynamic display of FIG. 4 because of a different triggering event.
Figure 6:
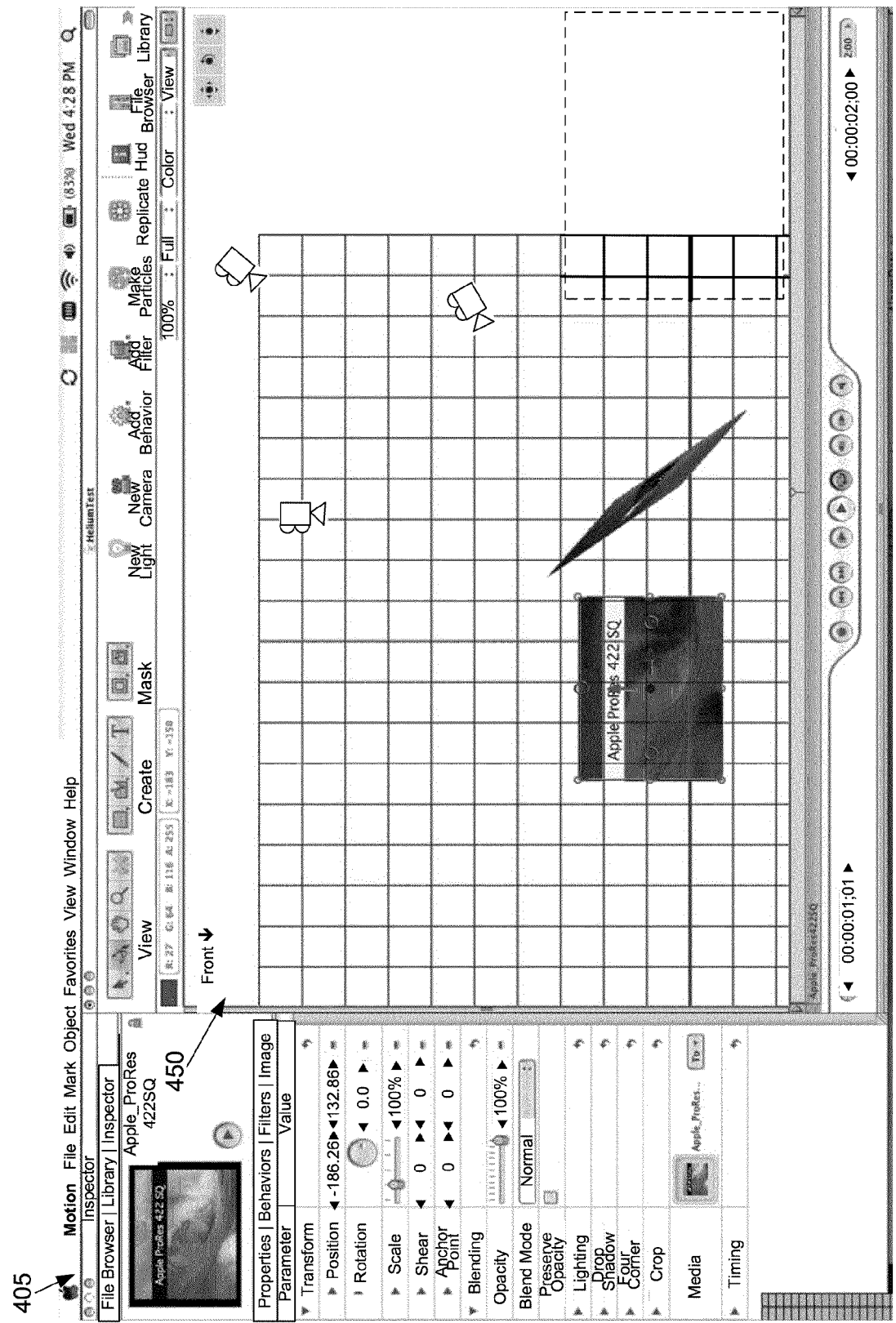
FIG. 6 illustrates the media-editing application once the triggering event of either FIG. 4

FIGS. 4-6 illustrate a media-editing application 405 that presents the dynamic display with different views as determined by various triggering events in accordance with some embodiments of the invention. Specifically, FIG. 4 illustrates the media-editing application 405 with a dynamic display 410 rendering the 3D project from a view of the camera object 420 during the modification of the camera object 420 within the active workspace 450 of the media-editing application 405.

In this figure, the active workspace 450 presents a front view of the 3D project. The 3D project specifies an environment that includes multiple different media objects placed within a 3D space. The environment includes editable image objects 460 and 470 and three camera objects 420, 430, and 440 disbursed throughout the 3D space. The workspace 450 is a static display window of the media-editing application 405. The active workspace 450 is static in the sense that a scene of the 3D project is continually rendered within the active workspace 450 irrespective of any user action to the 3D project or any user action within the media-editing application.

By selecting the view of the camera object 420 for the dynamic display 410, the dynamic display 410 is able to render how manipulations to the camera object 420 in the active workspace 450 affect what the camera object 430 renders. Moreover, the dynamic display is rendered in real-time such that the manipulations that occur in the active workspace 450 are simultaneously presented in the dynamic display 410 albeit from a different view than the active workspace 450. Accordingly, the active workspace 450 renders a scene of the 3D project from a particular view and the dynamic display 410 renders a different scene of the 3D project by rendering the scene from a different view.

In some embodiments, rendering of the active workspace 450 is given priority over rendering of the dynamic display 410 such that the dynamic display 410 is rendered after the active workspace 450 is updated to display any changes occurring therein. In some such embodiments, the real-time rendering becomes dependent on the processing resources of the computer system executing the media-editing application. To conserve processing resources for an underpowered system, some embodiments provide a customizable parameter for the rendering of the dynamic display 410. The parameter specifies particular intervals (e.g., every second) to update the dynamic display 410 instead of a continuous rendering of the dynamic display during the object manipulation in the active workspace 450.

FIG. 5 illustrates the media-editing application 405 with a dynamic display 510 having a different view than the dynamic display 410 of FIG. 4 because of a different triggering event. The triggering event of FIG. 5 is caused by the manipulation of object 460 that is not a camera object (e.g., image object). The dynamic display 510 presents a perspective view of the 3D project such that the affect of the manipulations to the object 460 are shown from the perspective view in addition to the front view of the active workspace 450.

Each of the dynamic displays 410 and 510 appear throughout the duration of the associated triggering event. Upon completion of the triggering event, the dynamic display 410 or 510 is removed from the media-editing application 405. FIG. 6 illustrates the media-editing application 405 once the triggering event of either FIG. 4 or FIG. 5 is complete and the dynamic display 410 or 510 is removed from the active workspace 450.

Though the dynamic displays 410 and 510 are shown rendering only a single view, some embodiments inset two or more different dynamic displays within the media-editing application during a triggering event. Each such dynamic display has a unique view that is different from the views of the other dynamic displays and the workspace windows of the media-editing application. Additionally, some embodiments permit users the ability to specify multiple workspace windows within the media-editing application, each with different views. Accordingly, when providing the one or more dynamic displays, some embodiments select the views for the one or more dynamic displays such that each selected view is different from the views of all other dynamic displays and all other workspace windows.

Several more detailed embodiments of the invention are described in the sections below. Before describing these embodiments further, Section II provides several more detailed embodiments for the media-editing application of some embodiments. Next, Section III describes the view selection process performed by some embodiments for dynamically selecting the view of the dynamic display based on the triggering event. Section IV describes some of the various parameters for customizing the functionality of the dynamic display in accordance with some embodiments. Lastly, Section V describes a computer system which implements some of the embodiments of the invention.

II. Media-Editing Application

Figure 7:
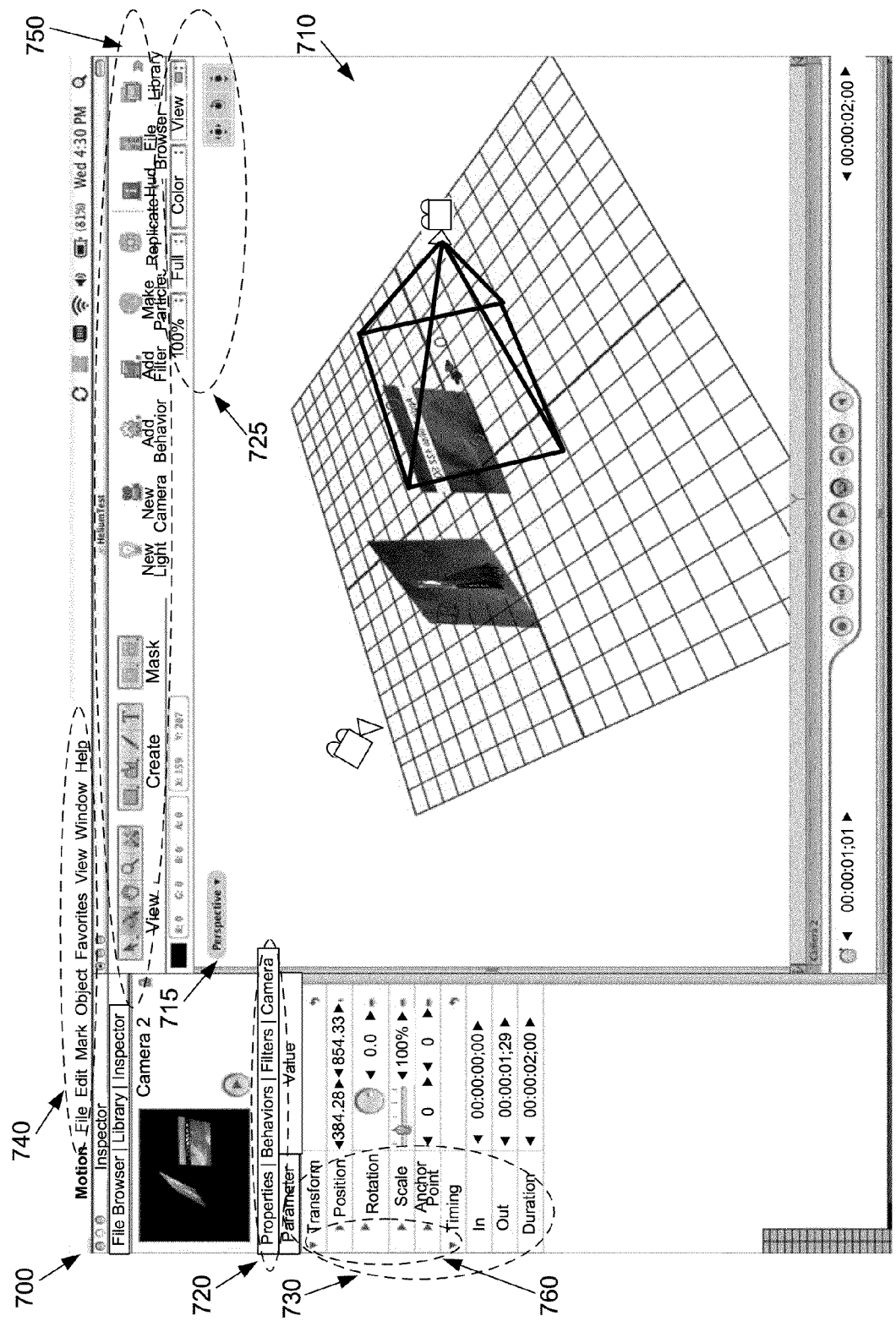
FIG. 7 shows a media-editing application in accordance with some embodiments of the invention.

FIG. 7 shows a media-editing application 700 in accordance with some embodiments of the invention. The media-editing application 700 provides (1) a main workspace window 710 to display objects of a 3D project within a 3D space, (2) a set of selectable tabs 720 reveal various functions 730 for manipulating the objects of the 3D project, (3) a set of various menu controls 740 for providing file management and object management functionality, and (4) a set of selectable icons 750 for adding objects to the 3D project and removing objects from the 3D project.

As noted above, the workspace window 710 is a static window that continually displays the 3D project from a selected view irrespective of user action within the media-editing application. Users manually select the view of the workspace 710 using the selectable item 715. Clicking the selectable item 715 presents a drop down list of available views for the workspace 710. The selectable items 725 are parameters that affect how the view of the workspace 710 is rendered and how the composition or layout of objects within the project are rendered. For example, some of the selectable items 725 permit an adjustment to the level with which the view zooms into the 3D space and whether the rendered result within the workspace 710 is in color or grayscale. It should be apparent to one of ordinary skill in the art that some embodiments of the media-editing application allow for the simultaneous displaying of multiple static workspace windows, each workspace window rendering the 3D project from a different view.

Additionally, each of the graphical representations for the objects appearing within the workspace 710 is fully editable. Users can drag and drop a graphical representation to manipulate a position of an object within the 3D space. Users can manipulate an object by clicking its corresponding graphical representation in order to modify attributes of the objects. Users can modify one or more attributes of an object using the functions 730 or icons 750 of the media-editing application 700. In some embodiments, objects within the 3D space include image objects, camera objects, text objects, video objects, mask objects, sound objects (that create spatial reconstruction of sound within the 3D space), drawing objects (e.g., brush strokes), light objects, effect objects (e.g., smoke effects, blur effects, filter effects), etc.

The set of selectable tabs 720 provide a means to access data related to object properties, behaviors, filters, and cameras. Some of the various object manipulating functionality is incorporated within sets of collapsible function menus 730. Each of the collapsible function menus 730 contain groups of related functions and parameters for manipulating one or more objects within the 3D space of the workspace 710. Each function is expandable and collapsible through the selectable user interface items 760.

Figure 8:
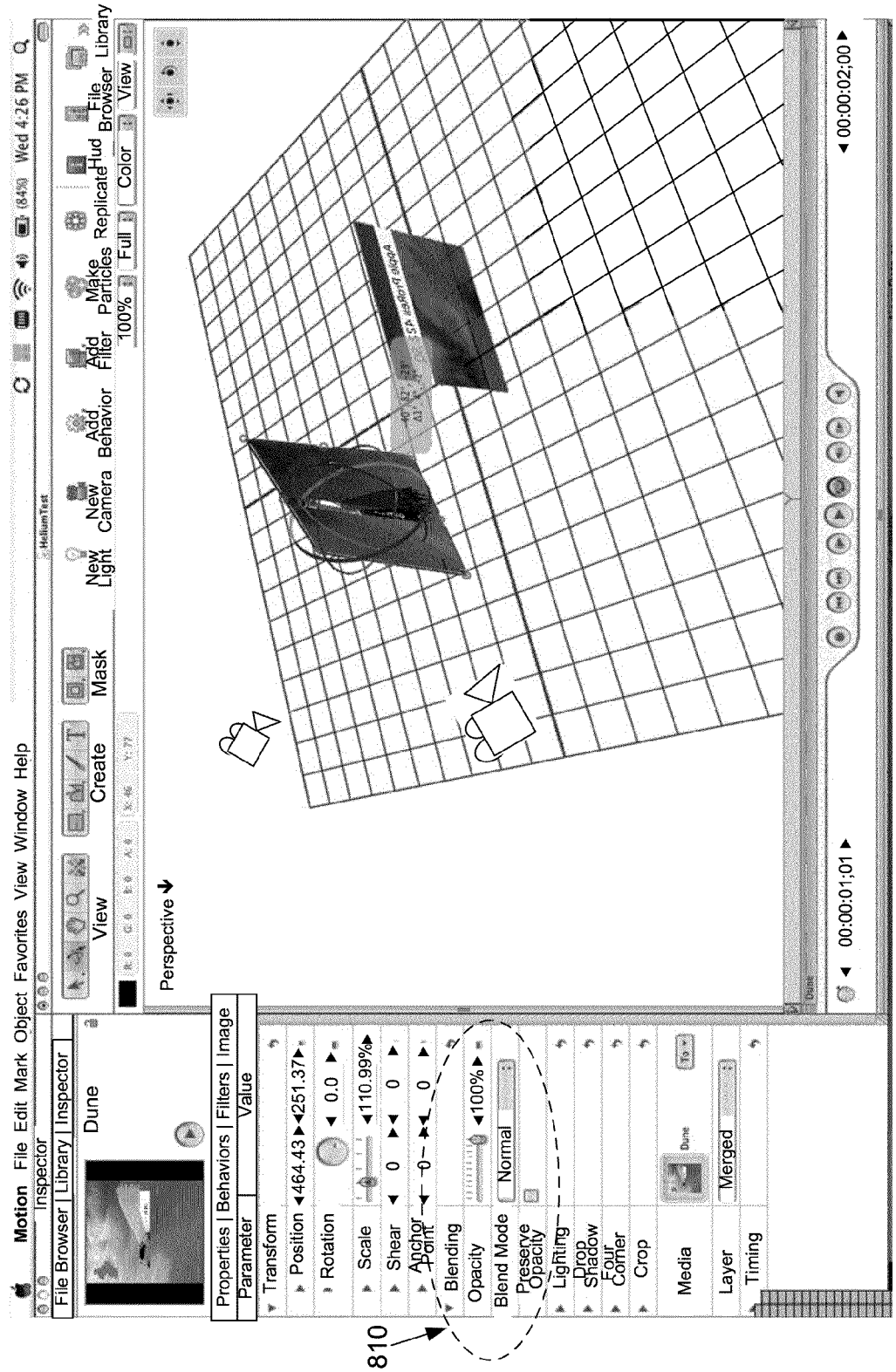
FIG. 8 illustrates the media-editing application of FIG. 7 with the collapsible function menu expanded to show the various functions and parameters for manipulating an object within the 3D space.

FIG. 8 illustrates the media-editing application 700 of FIG. 7 with the collapsible function menu 810 expanded to show the various functions and parameters for manipulating an object within the 3D space. The function menu 810 includes three object blending functions such as manipulating the opacity of an object, the type of blending to perform, and whether to preserve or discard the opacity manipulation.

Adjacent to each of the functions are parameters that determine the amount or degree of the change to the object produced by the function. A user may increase or decrease the impact of a given function by altering the specified parameter. As illustrated, some functions include a user interface slider item to adjust the corresponding parameter. The user interface slider item represents a range of values where different points along the sliding scale represent different values, each value adjusting the impact of the function. Adjacent to the user interface slider item is a user interface text item for direct entry of a numerical value. The user interface text item accepts values within the range of values represented by the user interface slider item. Values greater than or less than the acceptable range of values will either be automatically scaled to the next closest acceptable value or will create a prompt to notify the user of the invalid entry. The user interface item is also adjustable using the increasing and decreasing arrows surrounding the numerical value.

In some embodiments, the result of an object manipulation function is rendered in real-time within the active workspace window 710 and also in a dynamic display having a view different than the active workspace window 710 if the manipulation is identified as a triggering event for instantiating the dynamic display. Thus, sliding the opacity blending function slider across the range of acceptable values causes the display window to update the opacity of one or more objects in the 3D while also providing a secondary view of the changes through the dynamic display. When the changes to the object opacity is complete, the dynamic display is removed from the media-editing application 700.

Referring back to FIG. 7, the selectable icons 750 permit users the ability to add, remove, or modify objects in the 3D space. As shown, these objects may include light objects (e.g., spot lighting, diffused lighting, ambient lighting, global lighting, etc.) and camera objects with icons that modify the behavior of the objects and filters that modify how the camera object render the 3D space. Other objects such as image objects, video objects, etc. can be imported into the 3D space using the "file browser" icon within the selectable icons 750. Users can import these various objects into the media-editing application from a computer readable medium that may include a storage device of the computer system executing the media-editing application or other storage devices of other computing devices. Users can also load previously imported objects using the selectable "library" icon within the selectable icons 750. This icon accesses an object library of the media-editing application that in some embodiments is shared by multiple applications of the computer system.

In some embodiments, the composition of objects within the 3D space and the various behaviors and manipulations of the objects that together define the 3D project are retained within a cache or memory buffer of the computer system. The project is also permanently stored as a file on a computer readable medium of the computer system executing the media-editing application or some networked computer readable medium which the computer system executing the media-editing application remotely accesses.

III. Dynamic View Selection

In some embodiments, the dynamic display is dynamic in the sense that it only appears within the media-editing application when a triggering event occurs. The dynamic display is also dynamic in the sense that the selected view of the dynamic display is dynamic based on the triggering event and/or the view of the media-editing application workspaces. In this manner, the dynamic display provides an intelligent display that automatically tailors the view to the user's actions and thus the user's needs. Different triggering events cause the dynamic display to render with different views. Some embodiments utilize different heuristics to determine the suitable view of the dynamic display such that the dynamic display renders meaningful views in accordance with user actions within the workspace windows.

Figure 9:
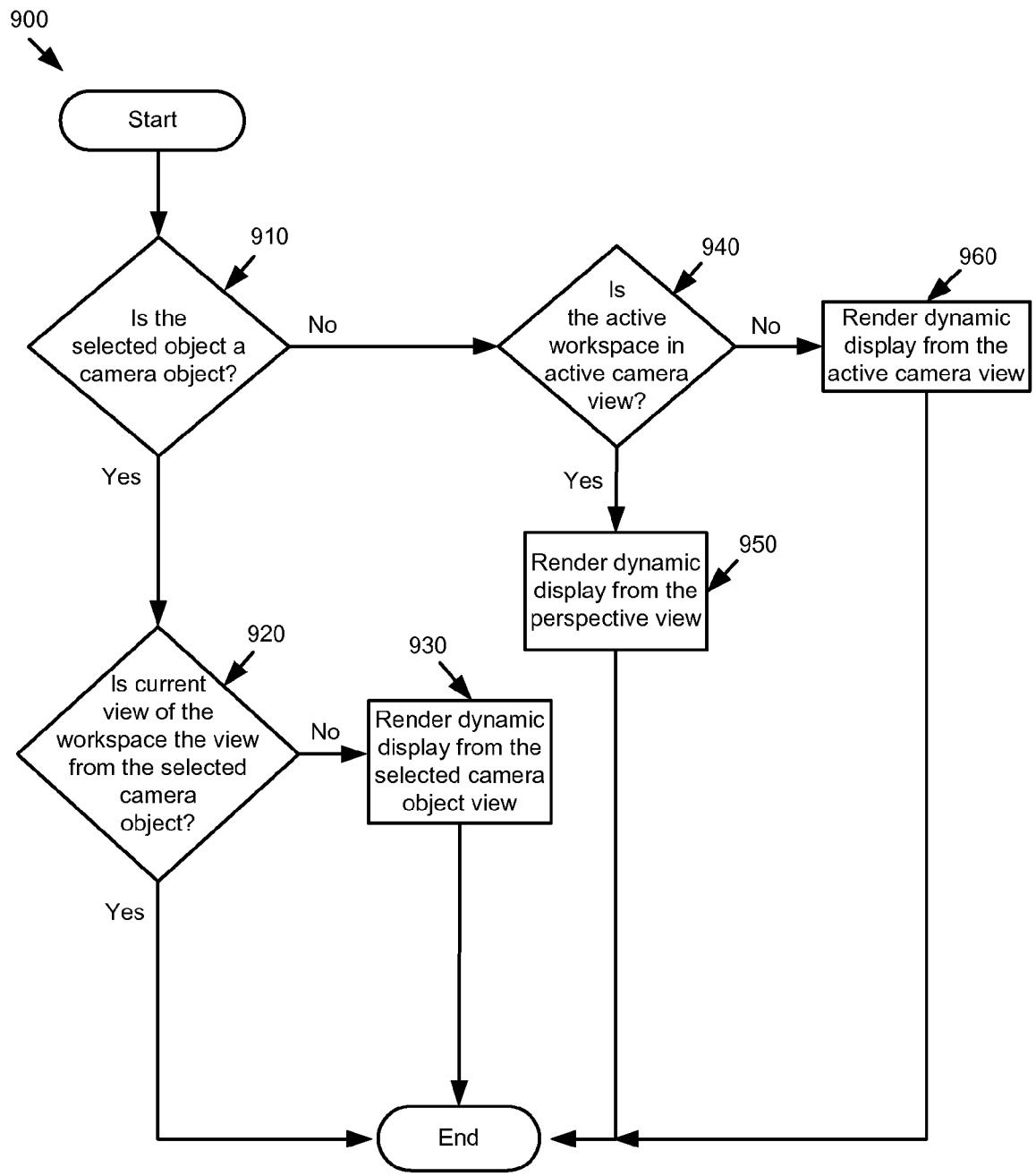
FIG. 9 presents a process for determining the view of the dynamic display prior to displaying the dynamic display within the active workspace.

FIG. 9 presents a process 900 for determining the view of the dynamic display prior to displaying the dynamic display within the media-editing application. The process 900 begins by determining (at 910) whether a detected triggering event involves the manipulation of a camera object of a 3D project. If the object being manipulated is a camera object, the process then determines (at 920) whether a current view of one or more workspaces of the media-editing application is the view of camera object. If so, the dynamic display is not displayed and the process ends. Otherwise, the process selects (at 930) the view of the dynamic display to be that of the manipulated camera object. In this manner, a user manipulating the camera object will be able to see in real-time how the manipulations to the camera object affect what the camera object renders. The user thus does not need to dedicate an entire workspace window to that camera object. Instead, the view for that camera object is automatically provided by some embodiments when the user manipulates the object and when the user actually needs the information provided by such a view.

Figure 10:
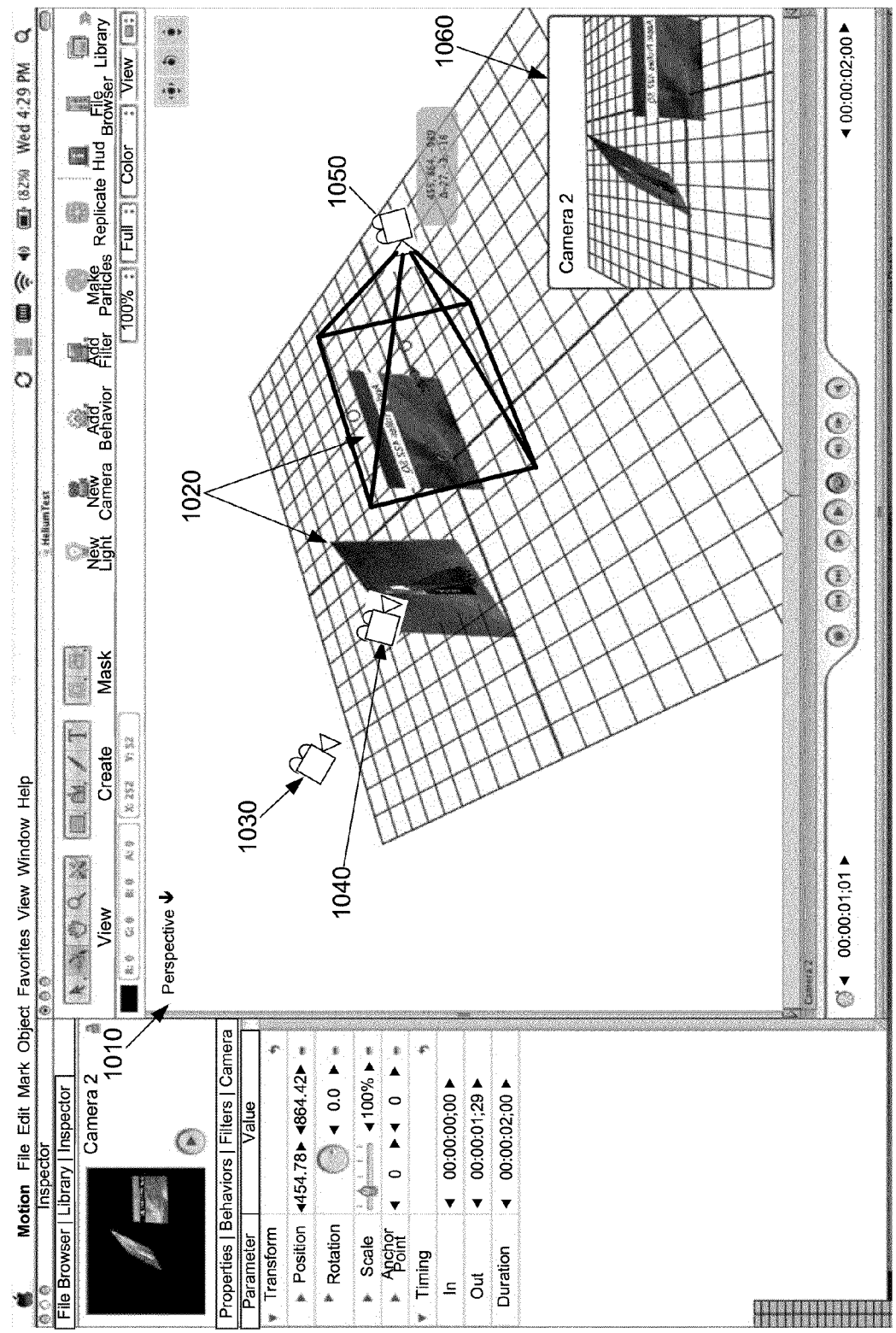
FIG. 10 illustrates the selection of the view of the dynamic display to be the view of a camera object currently being manipulated.
Figure 11:
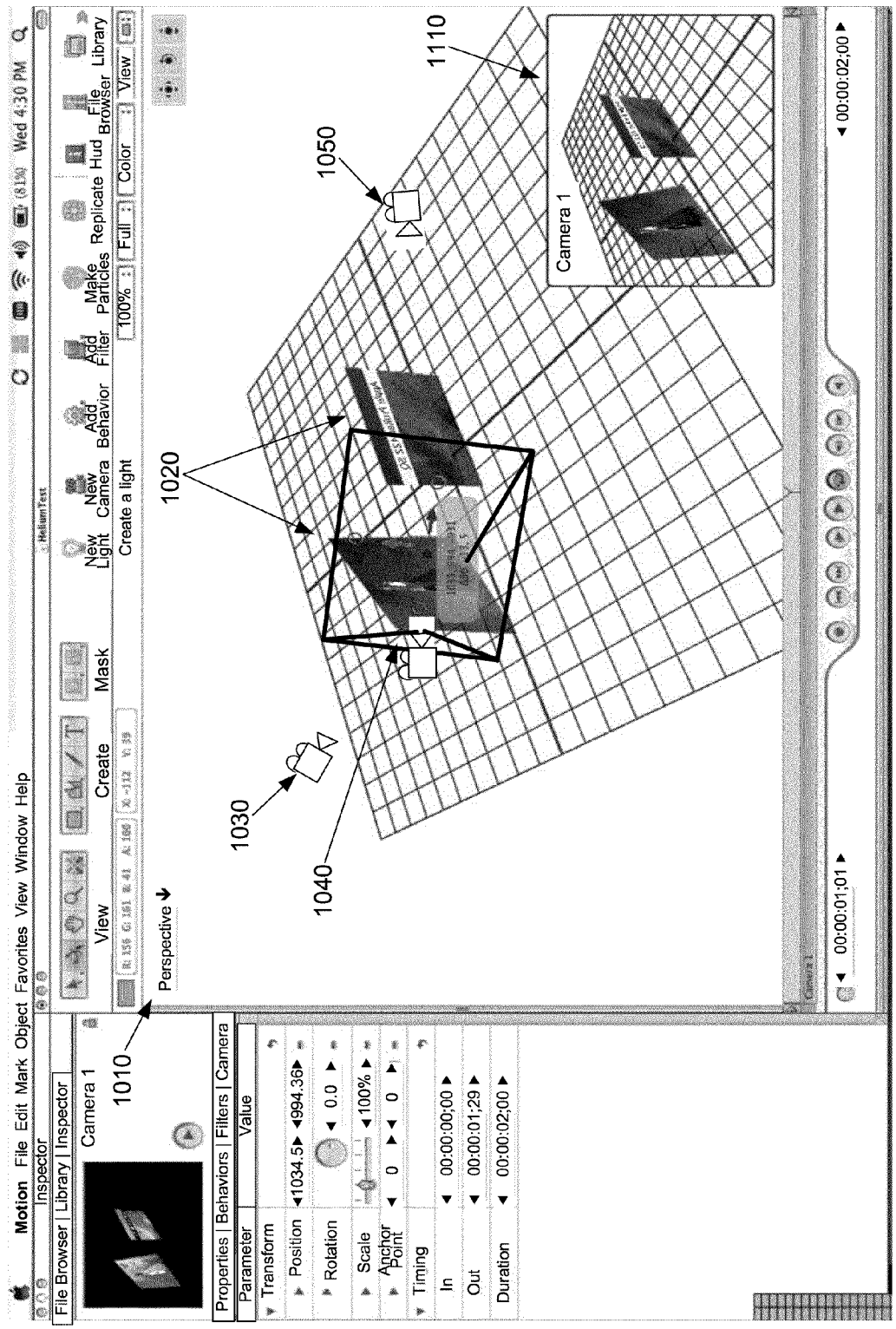
FIG. 11 illustrates dynamically changing the view of the dynamic display based on the selection of a different camera object.

Users may also specify multiple camera objects within a single 3D space. To define a workspace window to render the views provided by all such camera objects would be a waste of system resources and screen space. Therefore, by providing the dynamic display when a particular camera object is being manipulated, all relevant information is automatically provided to the user when needed without unnecessarily utilizing system resources or screen space. FIGS. 10 and 11 below illustrate a 3D space that includes multiple camera objects and the automatic view selection for the dynamic display based on a manipulation of each such camera object.

If the object being manipulated is not a camera object, the process determines (at 940) whether the view of the active workspace is an active camera view. If the active workspace is currently rendering the active camera view, then the process selects (at 950) the perspective view for rendering within the dynamic display. Otherwise, the process selects (at 960) the active camera view to be the view from which the dynamic display renders the project.

FIG. 10 illustrates the selection of the view of the dynamic display to be the view of a camera object currently being manipulated. In this figure, the active workspace 1010 includes two image objects 1020 and three camera objects 1030, 1040, and 1050. A user selects camera object 1050 for modification. As shown, the camera object 1050 is highlighted and a set of data is displayed adjacent to the camera object 1050. Based on the modification of the camera object 1050, some embodiments present the dynamic display 1060 with the view of the camera object 1050 being manipulated.

FIG. 11 illustrates dynamically changing the view of the dynamic display based on the selection of a different camera object 1040. In this figure, the user has selected camera object 1040 for manipulation. Accordingly, the dynamic display 1110 changes to present the view of the manipulated camera object 1040.

Figure 12:
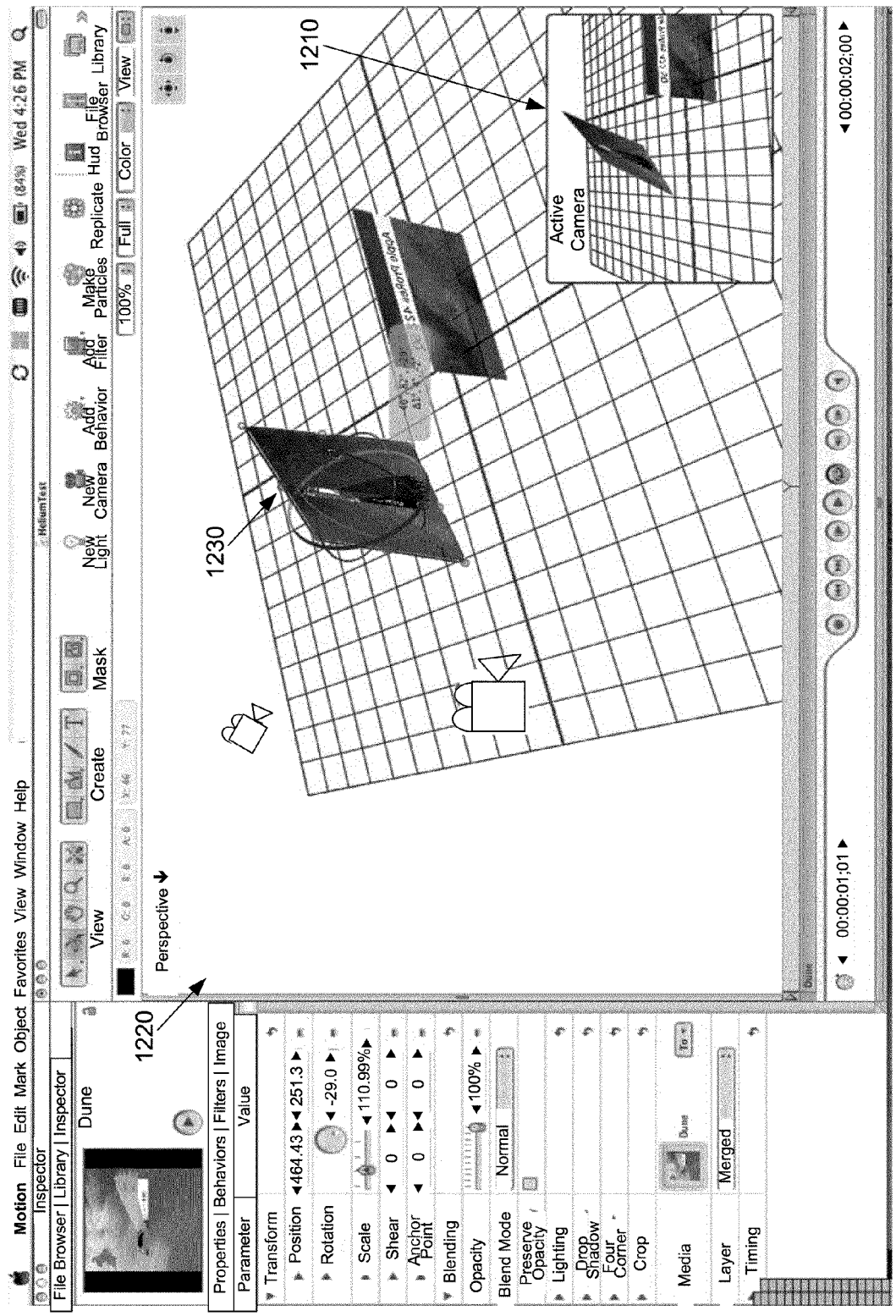
FIG. 12 illustrates providing the active camera view for the dynamic display when the active workspace renders from the perspective view. In this figure, the user has selected the image object for manipulation.

FIG. 12 illustrates providing the active camera view for the dynamic display 1310 when the active workspace 1320 renders from the perspective view. In this figure, the user has selected the image object 1230 for manipulation. Since the selected object is not a camera object, some embodiments identify the view of the active workspace 1220 and select a view for the dynamic display 1210 that does not overlap with the view of the active workspace 1220. Therefore, the dynamic display 1210 renders from the active camera view. It should be apparent to one of ordinary skill in the art that the active camera is not a static view, but rather one that can switch between various cameras within the 3D space. This is often the case when using the media-editing application to composite video clips where the video clip changes from a first camera to a second camera at a particular time interval of the video clip.

Figure 13:
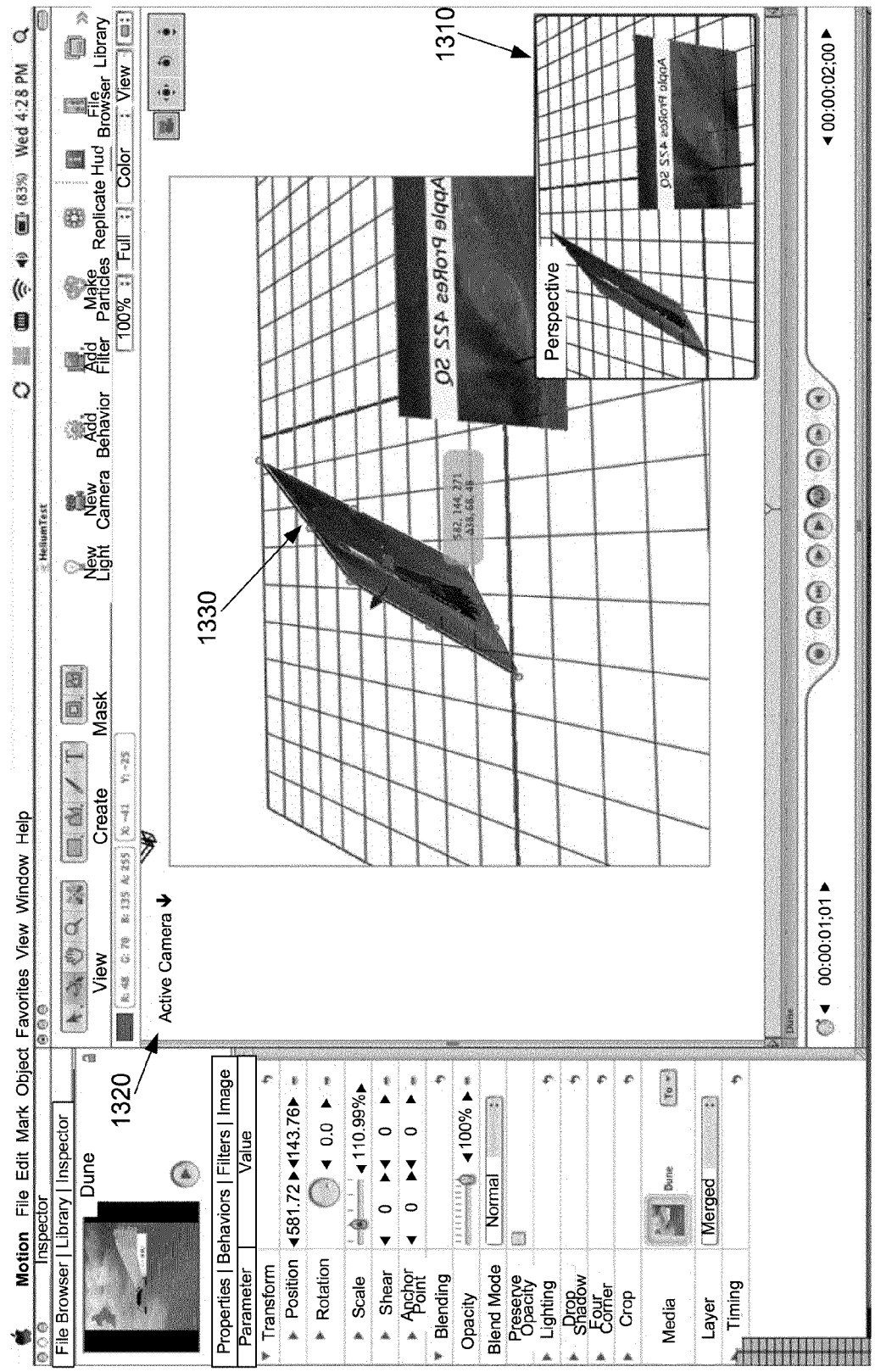
FIG. 13 illustrates providing the perspective view for the dynamic display when the active workspace renders from the active camera view.

FIG. 13 illustrates providing the perspective view for the dynamic display 1210 when the active workspace 1220 renders from the active camera view. Similar to FIG. 12, the user has selected the image object 1330 for manipulation. However, because the view for the active workspace 1320 is the active camera view, some embodiments intelligently avoid duplicating the same view within the dynamic display 1310 by instead selecting the perspective view as the view for the dynamic display 1310.

In some embodiments, the process 900 of FIG. 9 is a default process performed to determine the view of the dynamic display. Some embodiments permit users the ability to specify their own set of rules for selecting an appropriate and meaningful view for the dynamic display based on their actions. For instance, some users may specify that when a particular object is being manipulated within the 3D space, select the view of a camera object that is closest to the object being manipulated as the view for the dynamic display. Alternatively, some users may specify rules such that the view of the dynamic display is selected to be the view of a camera object within the 3D space that renders the largest portion of the image being manipulated. Accordingly, some embodiments provide full customized control over the view selection for the dynamic display by allowing a user to associate a particular view for the dynamic display based on a particular action or object manipulation within an active workspace. Additional customization parameters for the dynamic display are provided below in Section IV.

Figure 14:
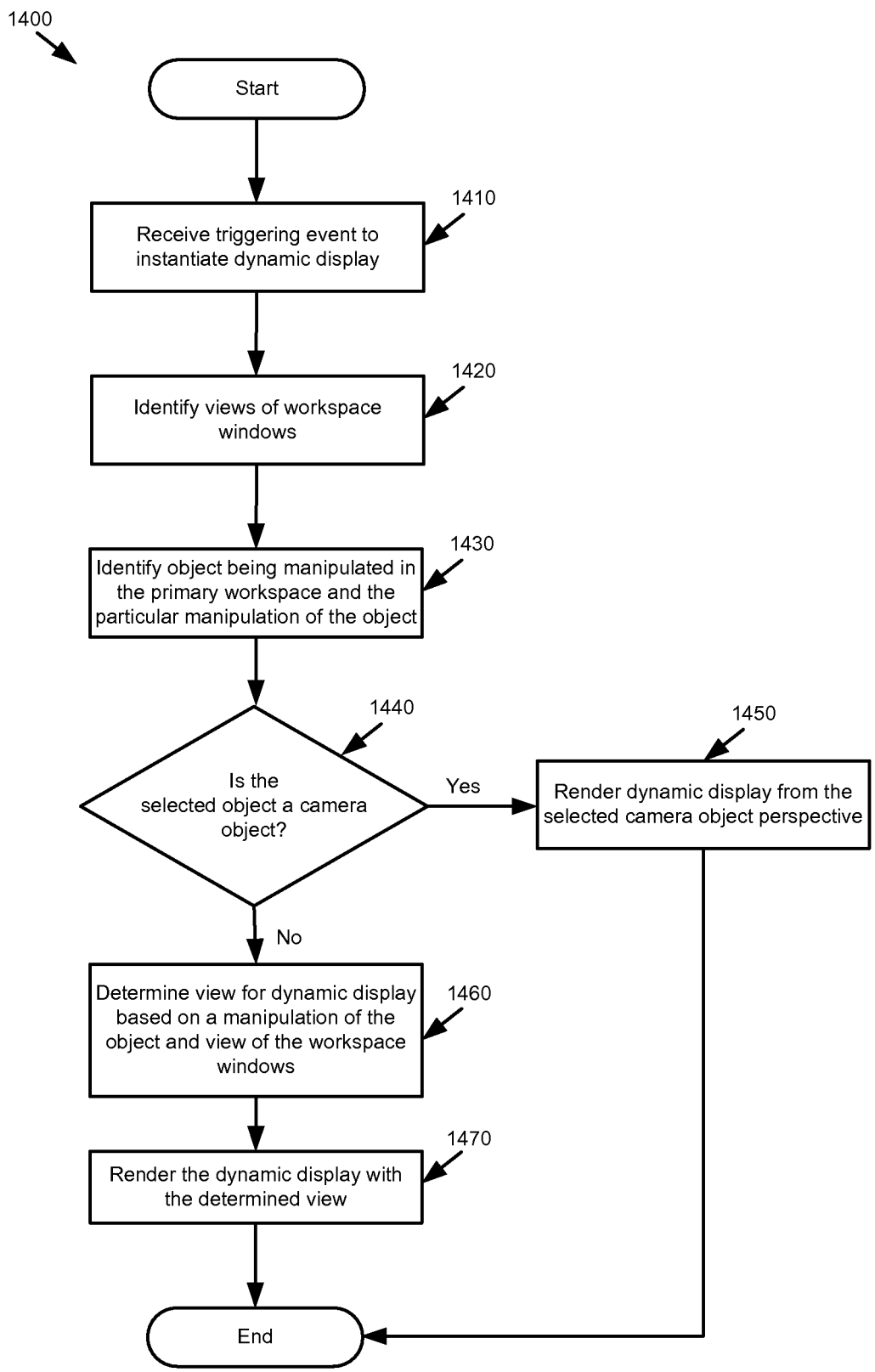
FIG. 14 presents a process for determining the view for the dynamic display based on the user actions.

Some embodiments select the view for the dynamic display based on user actions or object manipulations within the active workspace. FIG. 14 presents a process 1400 for determining the view for the dynamic display based on the user actions or object manipulations. The process 1400 begins by receiving (1410) a triggering event within the active workspace window of a media-editing application. The process identifies (at 1420) the current view of the active workspace to ensure that a selected view for the dynamic display does not provide the same view. Next, the process identifies (at 1430) the object being manipulated within the active workspace and the type of manipulation. For instance, a first manipulation may involve moving the object along the depth z-axis of the 3D space and a second manipulation may involve moving the object vertically along the y-axis of the 3D space.

The process determines (at 1440) whether the selected object is a camera object and if so renders (at 1450) the view of the dynamic display from the view of the camera object being manipulated. Otherwise, the process determines the view for the dynamic display based on the object manipulation and the view of the active workspace. This manner of intelligent view selection permits some embodiments to tailor the view of the dynamic display such that it adjusts according to the manipulation of the object performed by the user in the active workspace. Different manipulations cause the dynamic display to continually change as the manipulation occurs. Therefore, if a first identified manipulation involves moving the object along the depth z-axis of the 3D space, then the dynamic display will have a first view to best illustrate this first manipulation and if a second identified manipulation involves moving the object along the y-axis of the 3D space then the dynamic display will have a second view to best illustrate this second manipulation.

The views can be defined such that a predetermined optimal view is associated with each particular manipulation. For instance, some embodiments select a front view when an object is moved vertically with respect to another object in the 3D space. For such a manipulation operation, it is beneficial for the user to see how much one object obscures or reveals portions of the other object from the front view. However, for such a manipulation operation, there would be no benefit for the dynamic display to render from a top view.

Some embodiments define the view to also account for the orientation of the object within the 3D space. For instance, if an image object is aligned parallel to a vertical y-axis of an x-y-z 3D space, it is beneficial to provide a side view for the dynamic display such that the manipulations to the image object can be best displayed. If the image object is instead aligned parallel to a horizontal axis of the 3D space, it is beneficial to provide a top or bottom view for the dynamic display such that the manipulations to the image object can be best displayed.

Additionally, some embodiments also determine the field of view for the dynamic display when determining the particular view to render within the dynamic display. The field of view should be selected to provide sufficient information to the user without providing too much information where the information becomes indecipherable. When the field of view is too small, the affect of an object manipulation cannot be seen with respect to other surrounding objects. When the field of view is too large, too many objects are presented within the smaller dynamic display and since each object may only comprise a few pixels, the manipulations will not be clearly presented within the dynamic display. Therefore, the process 1400 of some embodiments accounts for user actions and other considerations (e.g., field of view) when determining the view of the dynamic display.

After determining the view for the dynamic display, the process 1400 presents the dynamic display within the media-editing application. The dynamic display then renders the 3D space according to the determined view of step 1460. It should be apparent that some embodiments allow the manual customization for the selection of the view of the dynamic display to work in conjunction with either processes 900 of FIG. 9 or 1400 of FIG. 14.

IV. Dynamic Display Parameters

Figure 15:
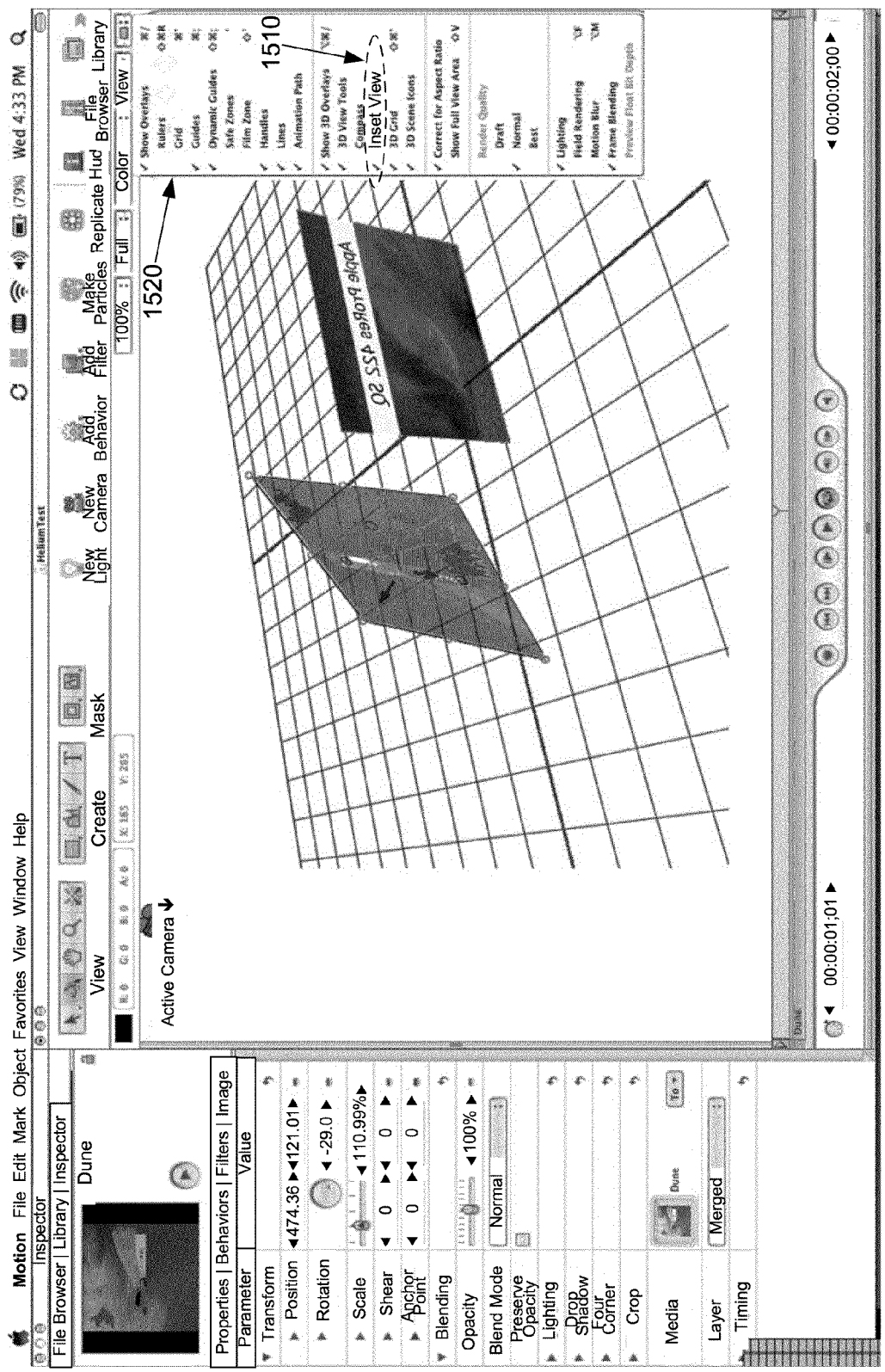
FIG. 15 illustrates a parameter for activating and deactivating the dynamic display functionality.
Figure 16:
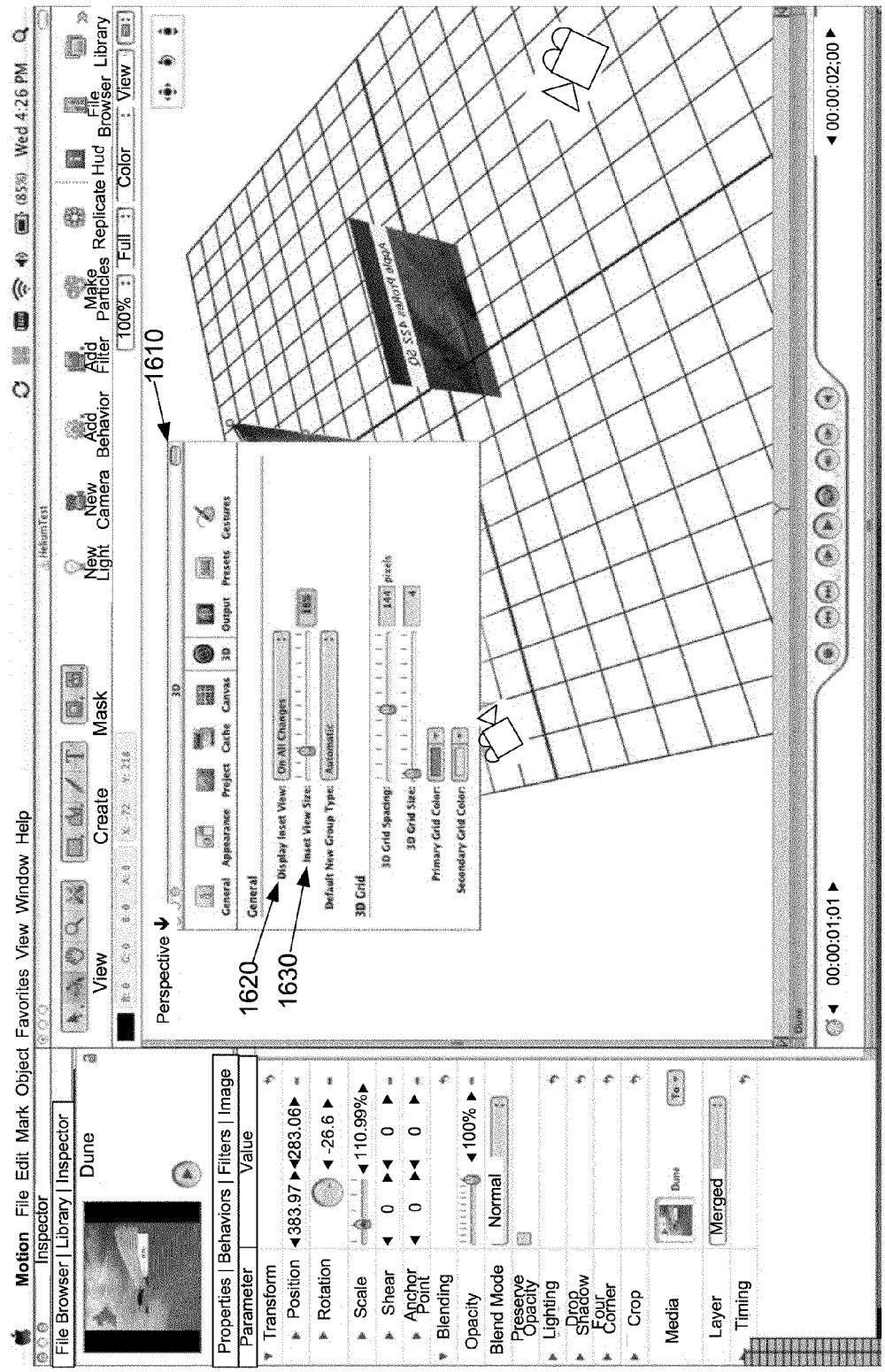
FIG. 16 illustrates various parameters related to the appearance of the dynamic display within the media-editing application.
Figure 17:
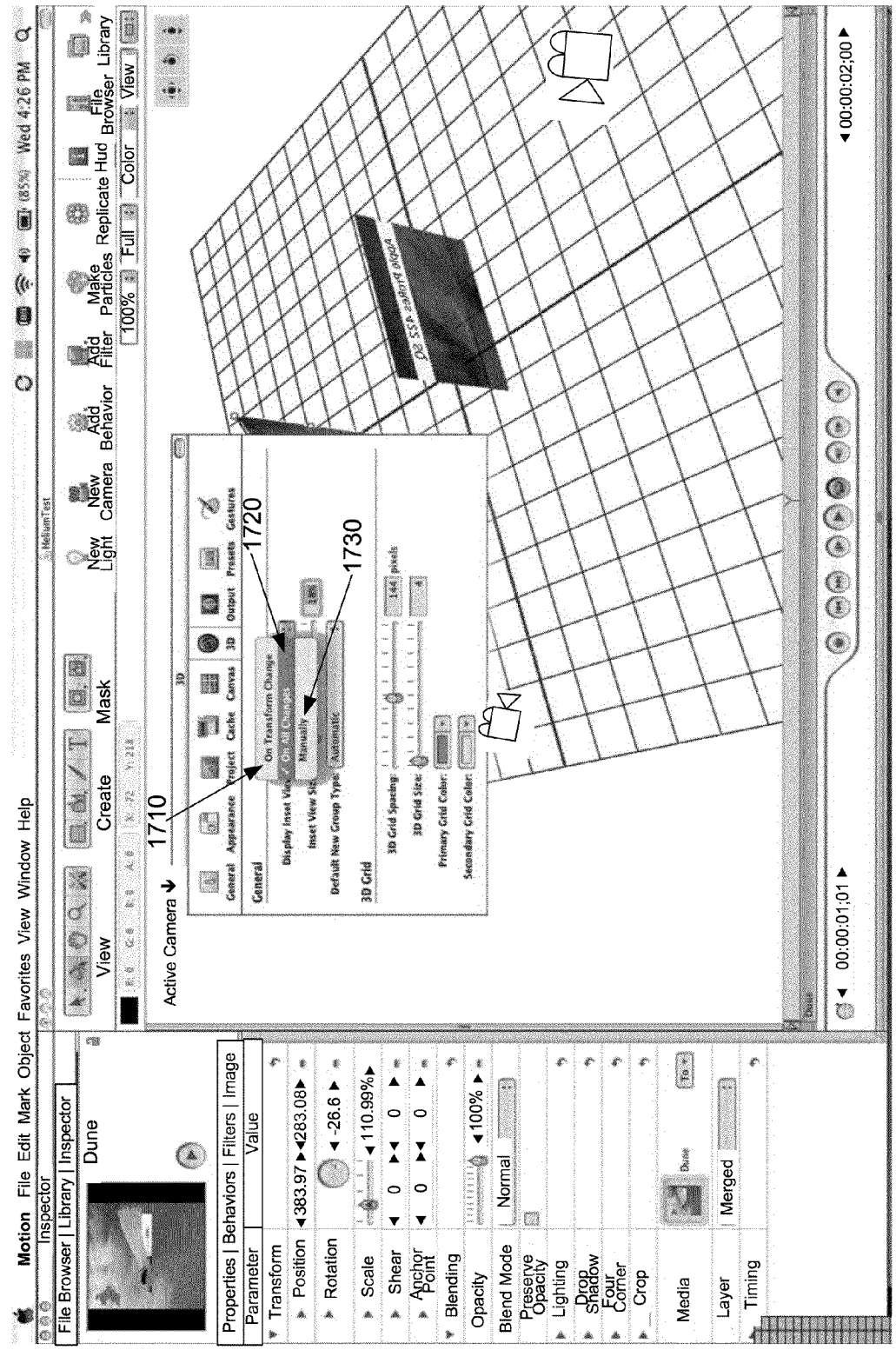
FIG. 17 illustrate some of the various options associated with the parameter.

FIGS. 15-17 illustrate some of the various parameters for customizing settings of the dynamic display in accordance with some embodiments. FIG. 15 illustrates a parameter for activating and deactivating the dynamic display functionality. Specifically, some embodiments of a media-editing application provide selectable drop down menus with selectable user interface items for setting various parameters of the dynamic display and other functionality associated with the media-editing application. By selecting item 1510 within the selectable drop down menu 1520, users are able to activate and deactivate the dynamic display functionality.

A check next to the user interface item 1510 indicates that the dynamic display functionality is active. Accordingly, any triggering events that occur within the active workspace will instantiate the dynamic display causing it to render a different view from that of the active workspace throughout the duration of the triggering event. When the user interface item 1510 is not checked, then the dynamic display will not display upon the occurrence of a triggering event.

FIG. 16 illustrates various parameters related to the appearance of the dynamic display within the media-editing application. The settings appear within a separate dialog window 1610 of the media-editing application. The settings are specified through selectable user interface items for selecting the triggering event sensitivity 1620 of the dynamic display and the size 1630 of the dynamic display.

Users select what actions within the active workspace act as triggering events for displaying the dynamic display by modifying parameter 1620. FIG. 17 illustrate some of the various options associated with the parameter 1620. As shown in FIG. 17, triggering events can be selected to include transform changes 1710 occurring within the active workspace or all changes occurring within the active workspace 1720. Alternatively, users may elect to manually control 1730 the dynamic display. It should be apparent to one of ordinary skill in the art that some embodiments provide a larger enumerated set of options for specifying the triggering events that instantiate the dynamic display. For instance, some embodiments provide a set of possible triggering events and check boxes associated with each event such that the user can select and deselect different combinations of events for specifying the instantiation of the dynamic display. Accordingly, users may select the dynamic display to appear upon an object rotation or movement, but not when the size of the object is changed.

The dynamic display size parameter 1630 of FIG. 16 allows users to customize the amount of information that is displayed within the dynamic display. By specifying a large dynamic display, more detail may be included within the dynamic display as the rendered objects within the dynamic display appear larger. Some embodiments provide a location parameter to specify the location of the dynamic display within a workspace window of the media-editing application. As shown in FIG. 10-13, the dynamic display window appears in the lower right corner. However, using the location parameter, users may customize where the dynamic display appears within the workspace.

Some embodiments further permit a user to specify a rendering rate parameter (not shown in FIGS. 17 and 16) to control the rate at which the dynamic display is updated. By default, the dynamic display of some embodiments provides a continuous rendering of the 3D project from a selected view. However, to conserve processing resources, users can specify that the dynamic display be updated only at particular intervals (e.g., every second) using the rendering rate parameter.

Similarly, some embodiments provide a parameter that controls the quality at which the dynamic display renders the project from the selected view. For instance, a user may require the highest possible resolution for the active workspace in order to view intricate details within the project, but the user may not need such detail in the dynamic display when the dynamic display is only used to provide quick preview of the project from a secondary view. In such cases, the user prefers to reduce the resolution with which the dynamic display renders the project so that the processing resources required by the dynamic display are minimized.

To specify custom views to associate with particular triggering events, some embodiments provide a view customization interface. The view customization interface contains various triggering events. The user may select a particular triggering event using a drop down box. The user may then associate a particular view to render within the dynamic display upon the occurrence of the triggering event. In some embodiments, this also occurs using a drop down list of selectable views.

In some embodiments, the dynamic display functionality may be incorporated into any media-editing application by way of a plug-in, applet, or direct function incorporated within the application itself. Accordingly, different media-editing applications, such as Apple Motion®, Autodesk Maya®, and Autodesk 3D Studio Max® may each incorporate the dynamic display function described herein. Additionally, the dynamic display functionality of some embodiments can be incorporated within the functionality of an operating system such as Microsoft Windows® or Apple Mac OS® when providing various media-editing operations.

V. Computer System

Figure 18:
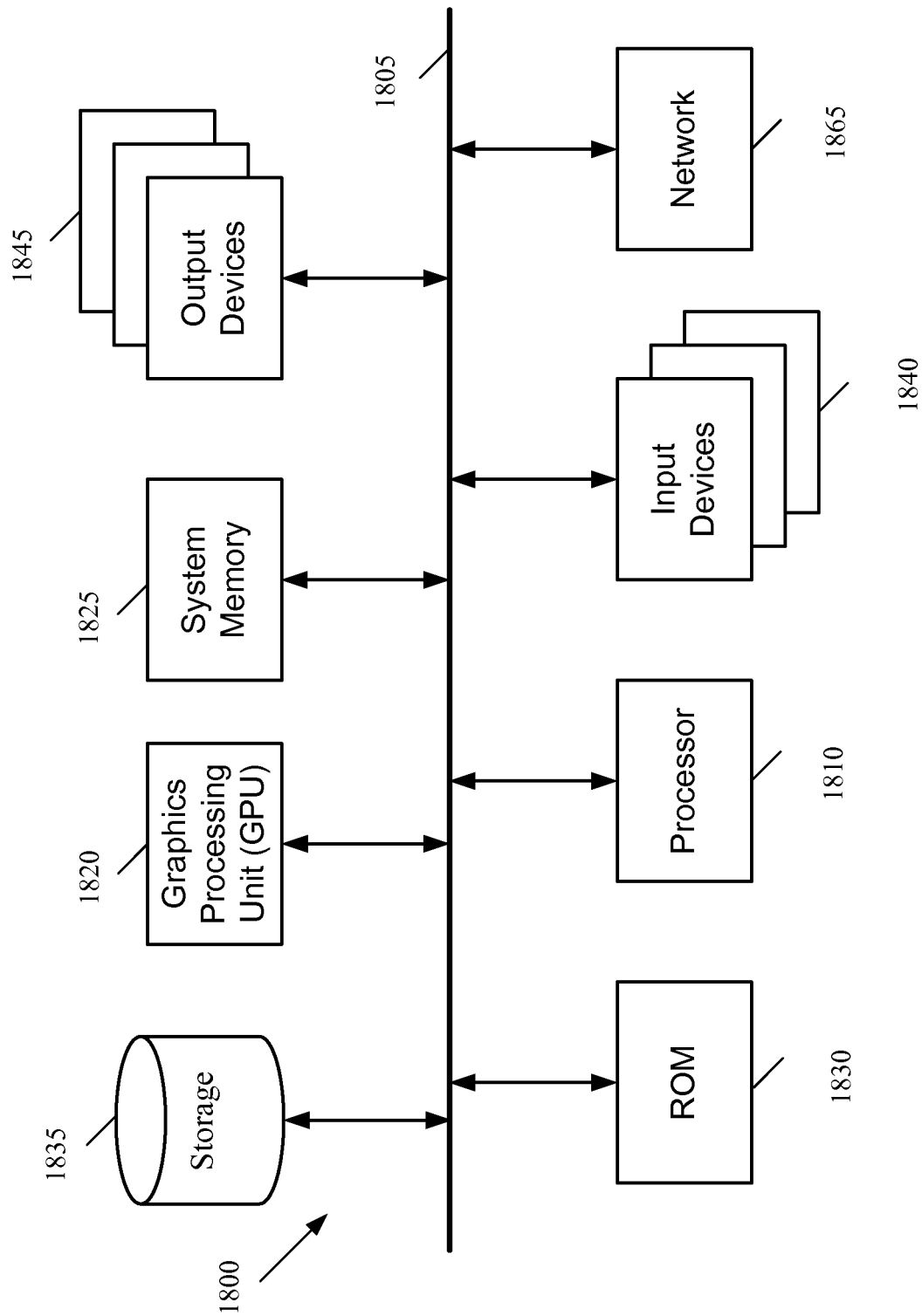
FIG. 18 illustrates a computer system with which some embodiments of the invention are implemented.

FIG. 18 illustrates a computer system with which some embodiments of the invention are implemented. Computer system 1800 includes a bus 1805, a processor 1810, a graphics processing unit (GPU) 1820, a system memory 1825, a read-only memory 1830, a permanent storage device 1835, input devices 1840, and output devices 1845.

The bus 1805 collectively represents all system, peripheral, and chipset buses that communicatively connect the numerous internal devices of the computer system 1800. For instance, the bus 1805 communicatively connects the processor 1810 with the read-only memory 1830, the GPU 1820, the system memory 1825, and the permanent storage device 1835.

From these various memory units, the processor 1810 retrieves instructions to execute and data to process in order to execute the processes of the invention. Some instructions are passed to and executed by the GPU 1820. The GPU 1820 can offload various computations or complement the image processing provided by the processor 1810. Such functionality can be provided using CoreImage's kernel shading language.

The read-only-memory (ROM) 1830 stores static data and instructions that are needed by the processor 1810 and other modules of the computer system. The permanent storage device 1835, on the other hand, is a read-and-write memory device. This device is a non-volatile memory unit that stores instructions and data even when the computer system 1800 is off. Some embodiments of the invention use a mass-storage device (such as a magnetic or optical disk and its corresponding disk drive) as the permanent storage device 1835.

Other embodiments use a removable storage device (such as a floppy disk or ZIP® disk, and its corresponding disk drive) as the permanent storage device. Like the permanent storage device 1835, the system memory 1825 is a read-and-write memory device. However, unlike storage device 1835, the system memory is a volatile read-and-write memory, such a random access memory. The system memory stores some of the instructions and data that the processor needs at runtime. In some embodiments, the invention's processes are stored in the system memory 1825, the permanent storage device 1835, and/or the read-only memory 1830. Together or separate, the above mentioned memories and storage devices comprise the computer readable medium of the computer system on which the media-editing application is stored and executed from, the objects used within the media-editing application are stored, and the files for defining the composition of the objects and behaviors of the objects within the 3D space of the media-editing application.

The bus 1805 also connects to the input and output devices 1840 and 1845. The input devices enable the user to communicate information and select commands to the computer system. The input devices 1840 include alphanumeric keyboards and pointing devices. The output devices 1845 display images generated by the computer system. For instance, these devices display a graphical user interface. The output devices include printers and display devices, such as cathode ray tubes (CRT) or liquid crystal displays (LCD).

Finally, as shown in FIG. 18, bus 1805 also couples computer 1800 to a network 1865 through a network adapter (not shown). In this manner, the computer can be a part of a network of computers (such as a local area network ("LAN"), a wide area network ("WAN"), or an Intranet, or a network of networks, such as the internet. For example, the computer 1800 may be coupled to a web server (network 1865) so that a web browser executing on the computer 1800 can interact with the web server as a user interacts with a graphical user interface that operates in the web browser. Any or all components of computer system 1800 may be used in conjunction with the invention.

While the invention has been described with reference to numerous specific details, one of ordinary skill in the art will recognize that the invention can be embodied in other specific forms without departing from the spirit of the invention. For instance, Apple Mac OS® environment and Apple Motion® tools are used to create some of these examples, a person of ordinary skill in the art would realize that the invention may be practiced in other operating environments such as Microsoft Windows®, UNIX®, Linux, etc., and other applications such as Autodesk Maya®, and Autodesk 3D Studio Max®, etc. Also, some of the examples may be executed on a GPU or CPU of a computer system depending on the computing resources available on the computer system or alternatively on any electronic device that is able to provide media-editing functionality. Thus, one of ordinary skill in the art would understand that the invention is not to be limited by the foregoing illustrative details, but rather is to be defined by the appended claims.

We claim:

1. A non-transitory machine readable medium storing a media editing application for editing a plurality of different objects within a three dimensional (3D) space, the application comprising sets of instructions for:
   displaying a first view of the 3D space comprising a set of camera objects and a set of non-camera objects in a first display area;
   detecting a manipulation of an object in the first display area;
   determining whether the manipulated object is a camera object or a non-camera object;
   when the manipulated object is a camera object, displaying a second view of the 3D space from a vantage point of the manipulated camera object in a second display area; and
   when the manipulated object is a non-camera object, displaying a third view of the 3D space that includes the manipulated non-camera object in the second display area, wherein the third view is preselected from a predetermined set of views based on the manipulation of the object, wherein the second display area appears within the first display area upon the manipulation, remains visible throughout the duration of the manipulation, and disappears upon completion of the manipulation.

2. The non-transitory machine readable medium of claim 1, wherein the third view is further based on the first view.

3. The non-transitory machine readable medium of claim 2, wherein the third view is based on a set of rules that determines the third view by accounting for the first view.

4. The non-transitory machine readable medium of claim 1, wherein the predetermined set of views comprises at least one of an active camera view, a perspective view, a top view, a side view, and a front view.

5. The non-transitory machine readable medium of claim 1, wherein the second display area is adjustable according to a set of parameters, and said set of parameters is associated with at least one control to modify a size of the second display area.

6. The non-transitory machine readable medium of claim 1, wherein the non-camera object is one of a layer object, a text object, a video object, an image object, a shape object, and a paint object.

7. The non-transitory machine readable medium of claim 1, wherein the manipulation of the object comprises moving the object through the 3D space, wherein the set of instructions for displaying the third view comprises a set of instructions for preselecting a view from the plurality of predetermined views that displays the movement of the object.

8. The non-transitory machine readable medium of claim 1, wherein the second and third views of the second display area are different from the first view of the first display area.

9. The non-transitory machine readable medium of claim 1, wherein the set of instructions for displaying the third view comprises sets of instructions for:
   preselecting a first predetermined view for a first manipulation occurring along a first dimension of the 3D space; and
   preselecting a second predetermined view for a second manipulation occurring along a second dimension of the 3D space, wherein dimensions of the 3D space comprise height, width, and depth dimensions.

10. The non-transitory machine readable medium of claim 1, wherein the second display area dynamically changes from the third view to a fourth view when the manipulation changes from a first manipulation to a second manipulation.

11. A method for editing a plurality of different objects within a three dimensional (3D) space, the method comprising:
    displaying a first view of the 3D space comprising a set of camera objects and a set of non-camera objects in a first display area;
    detecting a manipulation of an object in the first display area;
    determining whether the manipulated object is a camera object or a non-camera object;
    when the manipulated object is a camera object, displaying a second view of the 3D space from a vantage point of the manipulated camera object in a second display area; and
    when the manipulated object is a non-camera object, displaying a third view of the 3D space that includes the manipulated non-camera object in the second display area, wherein the third view is preselected from a predetermined set of views based on the manipulation of the object, wherein the second display area appears within the first display area upon the manipulation, remains visible throughout the duration of the manipulation, and disappears upon completion of the manipulation.

12. The method of claim 11, wherein the third view is further based on the first view.

13. The method of claim 12, wherein the third view is based on a set of rules that determines the third view by accounting for the first view.

14. The method of claim 11, wherein the predetermined set of views comprises at least one of an active camera view, a perspective view, a top view, a side view, and a front view.

15. The method of claim 11, wherein the second display area is adjustable according to a set of parameters, and said set of parameters is associated with at least one control to modify a size of the second display area.

16. The method of claim 11, wherein the non-camera object is one of a layer object, a text object, a video object, an image object, a shape object, and a paint object.

17. The method of claim 11, wherein the manipulation of the object comprises moving the object through the 3D space, wherein displaying the third view comprises preselecting a view from the plurality of predetermined views that displays the movement of the object.

18. The method of claim 11, wherein the second and third views of the second display area are different from the first view of the first display area.

19. The method of claim 11, wherein displaying the third view comprises:
preselecting a first predetermined view for a first manipulation occurring along a first dimension of the 3D space; and
preselecting a second predetermined view for a second manipulation occurring along a second dimension of the 3D space, wherein dimensions of the 3D space comprise height, width, and depth dimensions.

20. The method of claim 11, wherein the second display area dynamically changes from the third view to a fourth view when the manipulation changes from a first manipulation to a second manipulation.

21. An apparatus comprising:
a set of processing units; and
a non-transitory machine readable medium storing a media editing application for editing a plurality of different objects within a three dimensional (3D) space, the application comprising sets of instructions for:
displaying a first view of the 3D space comprising a set of camera objects and a set of non-camera objects in a first display area;
detecting a manipulation of an object in the first display area;
determining whether the manipulated object is a camera object or a non-camera object;
when the manipulated object is a camera object, displaying a second view of the 3D space from a vantage point of the manipulated camera object in a second display area; and
when the manipulated object is a non-camera object, displaying a third view of the 3D space that includes the manipulated non-camera object in the second display area, wherein the third view is preselected from a predetermined set of views based on the manipulation of the object, wherein the second display area appears within the first display area upon the manipulation, remains visible throughout the duration of the manipulation, and disappears upon completion of the manipulation.

22. The apparatus of claim 21, wherein the third view is further based on the first view.

23. The apparatus of claim 22, wherein the third view is based on a set of rules that determines the third view by accounting for the first view.

24. The apparatus of claim 21, wherein the predetermined set of views comprises at least one of an active camera view, a perspective view, a top view, a side view, and a front view.

25. The apparatus of claim 21, wherein the second display area is adjustable according to a set of parameters, and said set of parameters is associated with at least one control to modify a size of the second display area.

26. The apparatus of claim 21, wherein the non-camera object is one of a layer object, a text object, a video object, an image object, a shape object, and a paint object.

27. The apparatus of claim 21, wherein the manipulation of the object comprises moving the object through the 3D space, wherein the set of instructions for displaying the third view comprises a set of instructions for preselecting a view from the plurality of predetermined views that displays the movement of the object.

28. The apparatus of claim 21, wherein the second and third views of the second display area are different from the first view of the first display area.

29. The apparatus of claim 21, wherein the set of instructions for displaying the third view comprises sets of instructions for:
preselecting a first predetermined view for a first manipulation occurring along a first dimension of the 3D space; and
preselecting a second predetermined view for a second manipulation occurring along a second dimension of the 3D space, wherein dimensions of the 3D space comprise height, width, and depth dimensions.

30. The apparatus of claim 21, wherein the second display area dynamically changes from the third view to a fourth view when the manipulation changes from a first manipulation to a second manipulation.

* * * * *